US010396228B2

(12) United States Patent
Mayer et al.

(10) Patent No.: US 10,396,228 B2
(45) Date of Patent: Aug. 27, 2019

(54) QUANTUM DOT AND LUMINESCENT MATERIAL MADE THEREFROM

(71) Applicant: OSRAM Opto Semiconductors GmbH, Regensburg (DE)

(72) Inventors: Alex C. Mayer, Portland, OR (US); Shawn R. Scully, Portland, OR (US); Juanita N. Kurtin, Hillsboro, OR (US); Alex R. Guichard, Portland, OR (US); Steven M. Hughes, Hillsboro, OR (US); Oun-Ho Park, San Jose, CA (US); Paul-Emile B. Trudeau, Portland, OR (US); Colin C. Reese, Portland, OR (US); Manav Sheoran, Portland, OR (US); Georgeta Masson, Portland, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/369,752

(22) Filed: Dec. 5, 2016

(65) Prior Publication Data

US 2017/0084768 A1    Mar. 23, 2017

Related U.S. Application Data

(63) Continuation of application No. 13/287,407, filed on Nov. 2, 2011, now Pat. No. 9,525,092.
(60) Provisional application No. 61/410,754, filed on Nov. 5, 2010.

(51) Int. Cl.
  *H01L 31/05* (2014.01)
  *H01L 31/054* (2014.01)
  *H01L 31/055* (2014.01)
  *H01L 31/056* (2014.01)

(52) U.S. Cl.
  CPC ........ *H01L 31/0543* (2014.12); *H01L 31/055* (2013.01); *H01L 31/056* (2014.12); *H01L 31/0547* (2014.12); *Y02E 10/52* (2013.01)

(58) Field of Classification Search
  CPC . H01L 31/05; H01L 31/0543; H01L 31/0547; H01L 31/056; H01L 31/055; Y02E 10/52
  USPC ...................................................... 252/301
  See application file for complete search history.

(56) References Cited

U.S. PATENT DOCUMENTS

| | | | |
|---|---|---|---|
| 5,238,671 A | 8/1993 | Matson et al. | |
| 6,268,222 B1 | 7/2001 | Chandler et al. | |
| 6,322,901 B1 | 11/2001 | Bawendi et al. | |
| 7,394,094 B2 | 7/2008 | Halpert et al. | |
| 7,402,832 B2 | 7/2008 | Lee | |
| 7,405,002 B2 | 7/2008 | Ying et al. | |
| 7,645,397 B2 | 1/2010 | Parce et al. | |
| 7,776,630 B1 | 8/2010 | Kar et al. | |
| 7,824,731 B2 | 11/2010 | Ying et al. | |
| 8,178,202 B2 | 5/2012 | Halas et al. | |
| 8,404,154 B2 | 3/2013 | Breen et al. | |
| 2003/0124564 A1 | 7/2003 | Trau et al. | |
| 2003/0214699 A1 | 11/2003 | Banin et al. | |
| 2004/0118448 A1 | 6/2004 | Scher et al. | |
| 2004/0151898 A1 | 8/2004 | Reiss et al. | |
| 2005/0214536 A1 | 9/2005 | Schrier et al. | |
| 2005/0230673 A1 | 10/2005 | Mueller et al. | |
| 2005/0270350 A1 | 12/2005 | Vincent et al. | |
| 2006/0054863 A1 | 3/2006 | Dai et al. | |
| 2006/0068154 A1 | 3/2006 | Parce et al. | |
| 2006/0158089 A1 | 7/2006 | Saito et al. | |
| 2006/0245971 A1 | 11/2006 | Burns et al. | |
| 2007/0059705 A1 | 3/2007 | Lu | |
| 2007/0087195 A1 | 4/2007 | Meyer et al. | |
| 2007/0111350 A1 | 5/2007 | Weiss et al. | |
| 2007/0122101 A1 | 5/2007 | Buretea | |
| 2008/0237540 A1 | 10/2008 | Dubrow | |
| 2008/0290028 A1 | 11/2008 | Kim et al. | |
| 2008/0296534 A1 | 12/2008 | Lifshitz et al. | |
| 2008/0305334 A1 | 12/2008 | Jang et al. | |
| 2009/0068820 A1 | 3/2009 | Chan et al. | |
| 2009/0272426 A1 | 11/2009 | Winscom | |
| 2010/0032645 A1 | 2/2010 | Choi et al. | |
| 2010/0035365 A1 | 2/2010 | Wiesner et al. | |
| 2010/0044635 A1 | 2/2010 | Breen et al. | |
| 2010/0046072 A1 | 2/2010 | Matsunami et al. | |
| 2010/0068468 A1 | 3/2010 | Coe-Sullivan et al. | |
| 2010/0123155 A1 | 5/2010 | Pickett et al. | |
| 2010/0167011 A1 | 7/2010 | Dubrow | |
| 2010/0213437 A1 | 8/2010 | Akai et al. | |
| 2010/0237323 A1 | 9/2010 | Akai et al. | |
| 2010/0261263 A1 | 10/2010 | Vo-Dinh et al. | |
| 2010/0289001 A1 | 11/2010 | Kahen et al. | |
| 2010/0308271 A1 | 12/2010 | Bartel | |
| 2011/0022148 A1 | 1/2011 | Ruane et al. | |
| 2011/0150938 A1 | 6/2011 | Cao et al. | |
| 2011/0220194 A1 | 9/2011 | Kurtin et al. | |
| 2011/0311453 A1 | 12/2011 | Nie et al. | |
| 2012/0049119 A1 | 3/2012 | Greytak et al. | |
| 2012/0060897 A1 | 3/2012 | Bomm et al. | |
| 2012/0064134 A1 | 3/2012 | Bourke et al. | |
| 2012/0270231 A1 | 10/2012 | Smith et al. | |
| 2013/0115455 A1 | 5/2013 | Banin et al. | |
| 2013/0206219 A1 | 8/2013 | Kurtin et al. | |

FOREIGN PATENT DOCUMENTS

| | | |
|---|---|---|
| KR | 1020110106176 | 9/2011 |
| WO | WO-2009020436 | 2/2009 |
| WO | 2012018649 A2 | 2/2012 |

OTHER PUBLICATIONS

Final Office Action for U.S. Appl. No. 13/287,407, dated Jun. 5, 2013 15 pages.

(Continued)

*Primary Examiner* — Edward M Johnson
(74) *Attorney, Agent, or Firm* — Elliott, Ostrandez & Preston, P.C.

(57) ABSTRACT

A solar concentrator module (80) employs a luminescent concentrator material (82) between photovoltaic cells (86) having their charge-carrier separation junctions (90) parallel to front surfaces (88) of photovoltaic material 84 of the photovoltaic cells (86). Intercell areas (78) covered by the luminescent concentrator material (82) occupy from 2 to 50% of the total surface area of the solar concentrator modules (80). The luminescent concentrator material (82) preferably employs quantum dot heterostructures, and the photovoltaic cells (86) preferably employ low-cost high-efficiency photovoltaic materials (84), such as silicon-based photovoltaic materials.

25 Claims, 10 Drawing Sheets

(56) References Cited

OTHER PUBLICATIONS

K.A. Littau, et al., "A Luminescent Silicon Nanocrystal Colloid via a High-Temperature Aerosol Reaction" *The Journal of Physical Chemistry*, vol. 97, No. 6, (1993), pp. 1224-1230.

Xiaogang Peng et al., "Epitaxial Growth of Highly Luminescent CdSe/CdS Core/Shell Nanocrystals with Photostability and Electronic Accessibilty," *Journal of the American Chemical Society*, vol. 119, No. 30, (1997), pp. 7019-7029.

M.C. Schlamp et al., "Improved efficiencies in light emitting diodes made with CdSe(CdS) core/shell type nanocrystals and a semiconducting polymer" *Journal of Applied Physics*, vol. 82, No. 5837, (1997), pp. 5837-5842.

B.O. Dabbousi et al., "(CdSe)Zns Core-Shell Quantum Dots; Synthesis and Characteristion of a Size Series of Highly Luminescent Nanocrystallites," *Journal of Physical Chemistry*, vol. 101, No. 46, (1997), pp. 9463-9475.

Xiaogang Peng et al., "Shape control of CdSe nanocrystals" *Letters to Nature*, vol. 404, (2000), pp. 59-61.

Lianhua Qu, et al., "Alternative Routes toward High Quality CdSe Nanocrystals," *Nano Letters*, vol. 1, No. 6, (2001), pp. 333-337.

Z. Adam Peng and Xiaogang Peng., "Formation of High-Quality CdTe, CdSe, and CdS Nanocrystals Using CdO as Precursor" *Journal of American Chemical Society*, vol. 123, No. 1, (2001), pp. 183-184.

Z. Adam Peng and Xiaogang Peng., "Mechanisms of the Shape Evolution of CdSe Nanocrystals," *Journal of the American Chemical Society*, vol. 123, No. 7, (2001), pp. 1389-1395.

Z. Adam Peng and Xiaogang Peng., "Nearly Monodisperse and Shape-Controlled CdSe Nanocrystals via Alternative Routes: Nucleation and Growth," *Journal of the American Chemical Society*, vol. 124, No. 13, (2002), pp. 3343-3353.

Taleb Mokari and Uri Banin., "Synthesis and Properties of CdSe/ZnS Core/Shell Nanorods," *Chemical Mater*, vol. 15, No. 20, (2003), pp. 3955-3960.

Yinthai Chan, et al., "Incorporation of Luminescent Nanocrystals into Monodisperse Core-Shell Silica Microspheres," *Advanced Materials*, vol. 16, No. 23-24, (2004), pp. 2092-2097.

Thomas Nann and Paul Mulvaney, "Single Quantum Dots in Spherical Silica Particles," *Angewandte Chemie*, vol. 43, (2004), pp. 5393-5396.

Ming-Qiang Zhu, et al., "CdSe/CdS/SiO2 Core/Shell/Shell Nanoparticles," *Journal of Nanoscience and Nanotechnology*, vol. 7, (2007), pp. 2343-2348.

Masih Darbandi., "Silica coated nanocomposites", *Faculty of Applied Sciences*, (2007), entire document.

Rolf Koole,et al., "On the Incorporation Mechanism of Hydrophobic Quantum Dots in Silica Spheres by a Reverse Microemulsion Method," *Chemical Mater*, vol. 20, No. 7, (2008), pp. 2503-2512.

Yonggen Chen, et.al.., "Giant" Multishell CdSe Nanocrystal Quantum Dots with Suppressed Blinking, *Journal of American Chemical Society*, vol. 130, No. 15, (2008), pp. 6026-6027.

Myungie Cho, et al., "Facile synthesis and optical properties of colloidal silica microspheres encapsulating a quantum dot layer," *The Royal Society of Chemistry*, No. 46, (2010), pp. 5584-5586.

Rajiv Kumar et al., "In vitro and In vitro Optical Imaging Using Water-Dispersible, Noncytotoxic, Luminescent, Silca-Coated Quantum Rods," *Journal of the American Chemical Society*, vol. 22, No. 7, (2010), pp. 2261-2267.

Bhola N. Pal, et al., "Giant CdSe/CdS Core/Shell Nanocrystal Quantum Dots as Efficient Electroluminescent Materials; Strong Influence of Shell Thickness on Light-Emitting Diode Performance," *Journal of the American Chemical Society*, No. 12, (2012), pp. 331.

Luigi Carbone, et al., "Synthesis and Micrometer-Scale Assembly of Colloidal CdSe/CdS Nanorods Prepared by a Seeded Growth Approach," *Journal of the American Chemical Society*, vol. 7, No. 10, (2007), pp. 2942-2950.

Hua Zou et al., "Polymer/Silica Nanocomposites: Preparation, Characterization, Properties, and Applications," *Journal of the American Chemical Society*, vol. 108, No. 9, (2008), pp. 3893-3957.

Lei Qian, et al., "High efficiency photoluminescence from silica-coated CdSe quantum dots," *American Institute of Physics*, No. 94, (2009).

Ye Sun, et al., "Fabrication and optical properties of thin silica-coated CdSe/ZnS quantum dots," *Phys. Status Solidi A*, vol. 206, No. 12, (2009), pp. 2822-2825.

Baranov et al., "Effect of ZnS shell thickness on the phonon spectra in CdSe quantum dots," *Physical Review*, B 68, (2003), pp. 165306-1 165306-7.

Burda, C et al., "Chemistry and properties of nanocrystals of different shapes," *Chem. Rev.* vol. 105, No. 4, (2005), pp. 1025-1102.

Arkles, "*Dipodal Silanes*", website adhesivesmag.com/articles/dipodal-silanes, (2008), 3 pages.

Final Office Action for U.S. Appl. No. 13/287,407, dated Apr. 1, 2014, 15 pages.

Talapin, Dmitri V. et al., "Highly Emissive Colloidal CdSe/CdS Heterostructures of Mixed Dimensionality," *American Chemical Society, Nano Letters*, vol. 3, No. 12, (2003), pp. 1677-1681.

Reiss, Peter et al., "Core/Shell Semiconductor Nanocrystals," *Small*, vol. 5, No. 2, (2009), pp. 154-168.

Non-Final Office Action for U.S. Appl. No. 13/287,407, dated Jan. 16, 2013.

"Final Office Action for U.S. Appl. No. 13/287,407, dated Aug. 25, 2015."

"Office Action for U.S. Appl. No. 13/287,407", (dated Sep. 29, 2014), Whole Document.

De Mello Donega, Celso , et al., "Single-Step Synthesis to Control the Photoluminescence Quantum Yield and Size Dispersion of CdSe Nanocrystals", *2003 American Chemical Society, J. Phys. Chem. B* 2003, 107, 489-496. Published on Wed Dec. 12, 2002.

Deka, et al., "CdSe/CdS/ZnS Double Shell Nanorods with High Photoluminescence Efficiency and Their Exploitation as Biolabeling Probes" *Journal of the American Chemical Society*, vol. 131, No. 8, (2009), pp. 2948-2958.

Dubertret, Benoit , et al., "In Vivo Imaging of Quantum Dots Encapsulated in Phospholipid Micelles", *Science published by the American Association for the Advancement of Science*, vol. 298, 1759-1762, Nov. 29, 2002.

Manna, Liberato , et al., "Epitaxial Growth and Photochemical Annealing of Graded CdS/ZnS Shells on Colloidal CdSe Nanorods", *Journal of the American Chemical Society*, 2002, vol. 124, No. 24, pp. 7136-7145.

Reiss, J.D. , et al., "Efficient Compression of Oversampled 1-bit Audio Signals", *Audio Engineering Society, Convention Paper*, Presented at the 111th Convention, New York, NY, USA., (Sep. 21-24, 2001).

Yu, W. William , et al., "Experimental Determination of the Extinction Coefficient of CdTe, CdSe, and CdS Nanocrystals", *2003 American Chemical Society, Chem. Mater.* 2003, 15, 2854-2860. Published on the Web Jun. 7, 2003.

Alivisatos, A. P., "Perspectives on the Physical Chemistry of Semiconductor Nanocrystals"; J. Phys. Chem., vol. 100, No. 31, 1996, pp. 13226-13239.

Arkles, B., et al, "Dipodal Silanes", website adhesivesmag.com/articles/dipodal-silanes, (2008), 3 pages.

Baranov et al., "Effect of ZnS shell thickness on the phonon spectra in CdSe quantum dots," Physical Review, B 68, (2003), pp. 165306-113 165306-7.

Bawendi, M. G., et al., The Quantum Mechanics of Larger Semiconductor Clusters ("Quantum Dots"); Annual Review of Physical Chemistry, vol. 41, 1990, pp. 477-496.

Carbone, L., et al., "Synthesis and Micrometer-Scale Assembly of Colloidal CdSe/CdS Nanorods Prepared by a Seeded Growth Approach," Nano Lett., vol. 7, No. 10, 2007, pp. 2942-2950.

Chan, Y., et al., "Incorporation of Luminescent Nanocrystals into Monodisperse Core-Shell Silica Microspheres," Advanced Materials, vol. 16, No. 23-24, 2004, pp. 2092-2097.

(56) References Cited

OTHER PUBLICATIONS

Chen, Y., et.al., "Giant" Multishell CdSe Nanocrystal Quantum Dots with Suppressed Blinking, Journal of the American Chemical Society, vol. 130, No. 15, 2008, pp. 6026-6027.

Cho, M., et al., "Facile synthesis and optical properties of colloidal silica microspheres encapsulating a quantum dot layer," The Royal Society of Chemistry, No. 46, 2010, pp. 5584-5586.

Dabbousi, B.O., et al., "(CdSe)Zns Core-Shell Quantum Dots; Synthesis and Characteristion of a Size Series of Highly Luminescent Nanocrystallites," Journal of Physical Chemistry, vol. 101, No. 46, 1997, pp. 9463-9475.

Darbandi, M., "Silica coated nanocomposites", Faculty of Applied Sciences, 2007, entire document.

De Mello Donega, C., et al., Single-Step Synthesis to Control the Photoluminescence Quantum Yield and Size Dispersion of CdSe Nanocrystals, J. Phys. Chem. B 2003, 107, 2003, pp. 489-496.

Deka, S., et al., "CdSe/CdS/ZnS Double Shell Nanorods with High Photoluminescence Efficiency and Their Exploitation as Biolabeling Probes" Journal of the American Chemical Society, vol. 131, No. 8, 2009, pp. 2948-2958.

Dubertert et al., "In Vivo Imaging of Quantum Dots Encapsulated in Phospholipid Micelles," Science, vol. 298, 2002, pp. 1759-1762.

Final Office Action for U.S. Appl. No. 13/287,407, dated Apr. 1, 2014, 15 pgs.

Final Office Action for U.S. Appl. No. 13/287,407, dated Jun. 5, 2013, 15 pgs.

Final Office Action for U.S. Appl. No. 13/287,407, dated Aug. 25, 2015, 22 pgs.

Koole, R. et al., "On the Incorporation Mechanism of Hydrophobic Quantum Dots in Silica Spheres by a Reverse Microemulsion Method," Chemical Mater, vol. 20, No. 7, 2008, pp. 2503-2512.

Kumar, R., et al., "In vitro and in vitro Optical Imaging Using Water-Dispersible, Noncytotoxic, Luminescent, Silca-Coated Quantum Rods," Chem. Mater., vol. 22, No. 7, 2010, pp. 2261-2267.

Littau, K.A. et al., "A Luminescent Silicon Nanocrystal Colloid via a High-Temperature Aerosol Reaction" The Journal of Physical Chemistry, vol. 97, No. 6, 1993, pp. 1224-1230.

Manna L., et al., "Controlled growth of tetrapod-branched inorganic nanocrystals"; Nature Materials, vol. 2, May 25, 2003, pp. 382-385.

Manna, L., et al., "Epitaxial Growth and Photochemical Annealing of Graded CdS/ZnS Shells on Colloidal CdSe Nanorods", Journal of the American Chemical Society, vol. 124, No. 24, 2002, pp. 7136-7145.

Mokari, T., et al., "Synthesis and Properties of CdSe/ZnS Core/Shell Nanorods," Chemical Mater, vol. 15, No. 20, 2003, pp. 3955-3960.

Nann, T., et al., "Single Quantum Dots in Spherical Silica Particles," Angewandte Chemie, vol. 43, 2004, pp. 5393-5396.

Non-final Office Action for U.S. Appl. No. 13/287,407, dated Jan. 21, 2015, 21 pgs.

Non-final Office Action for U.S. Appl. No. 13/287,407, dated Jan. 16, 2013, 15 pgs.

Non-final Office Action for U.S. Appl. No. 13/287,407, dated Sep. 29, 2014, 21 pgs.

Non-final Office Action for U.S. Appl. No. 13/287,407, dated Nov. 14, 2013, 19 pgs.

Notice of Allowance for U.S. Appl. No. 13/287,407 dated Aug. 11, 2016, 7 pgs.

Pal, B.N., et al., "Giant CdSe/CdS Core/Shell Nanocrystal Quantum Dots as Efficient Electroluminescent Materials; Strong Influence of Shell Thickness on Light-Emitting Diode Performance," Nano Lett., 12(1), 2012, pp. 331-336.

Peng, X., et al., "Epitaxial Growth of Highly Luminescent CdSe/CdS Core/Shell Nanocrystals with Photostability and Electronic Accessibilty," Journal of the American Chemical Society, vol. 119, No. 30, 1997, pp. 7019-7029.

Peng, X., et al., "Shape control of CdSe nanocrystals" Letters to Nature, vol. 404, 2000, pp. 59-61.

Peng, Z. A., et al, "Formation of High-Quality CdTe, CdSe, and CdS Nanocrystals Using CdO as Precursor" Journal of American Chemical Society, vol. 123, No. 1, 2001, pp. 183-184.

Peng, Z. A., et al, "Mechanisms of the Shape Evolution of CdSe Nanocrystals," Journal of the American Chemical Society, vol. 123, No. 7, 2001, pp. 1389-1395.

Peng, Z. A., et al., "Nearly Monodisperse and Shape-Controlled CdSe Nanocrystals via Alternative Routes: Nucleation and Growth," Journal of the American Chemical Society, vol. 124, No. 13, 2002, pp. 3343-3353.

Qian, L., et al., "High efficiency photoluminescence from silica-coated CdSe quantum dots," Appl. Phys. Lett., No. 94, 2009, 073112.

Qu, L., et al., "Alternative Routes toward High Quality CdSe Nanocrystals," Nano Letters, vol. 1, No. 6, 2001, pp. 333-337.

Reiss, P., et al., "Core/Shell Semiconductor Nanocrystals," Small, vol. 5, No. 2, 2009, pp. 154-168.

Scher, E. C., et al., "Shape Control and Applications of Nanocrystals", Phil. Trans. R. Soc. Lond. A, 361, Dec. 17, 2002, pp. 241-257.

Schlamp, M.C., et al., "Improved efficiencies in light emitting diodes made with CdSe(CdS) core/shell type nanocrystals and a semiconducting polymer" Journal of Applied Physics, vol. 82, 1997, pp. 5837-5842.

Selvan, S. T., et al., "Robust, Non-Cytotoxic, Silica-Coated CdSe Quantum Dots with Efficient Photoluminescence"; Advanced Materials, vol. 17, Issue 13, May 4, 2005, pp. 1620-1625.

Sun,Y., et al., "Fabrication and optical properties of thin silica-coated CdSe/ZnS quantum dots," Phys. Status Solidi A, vol. 206, No. 12, 2009, pp. 2822-2825.

Talapin, D. V., et al., "Dynamic Distribution of Growth Rates within the Ensembles of Colloidal II-VI and III-V Semiconductor Nanocrystals as a Factor Governing Their Photoluminescence Efficiency"; J. Am. Chem. Soc., 124 (20), Apr. 30, 2002, pp. 5782-5790.

Talapin, D. V., et al., "Highly Emissive Colloidal CdSe/CdS Heterostructures of Mixed Dimensionality," Nano Letters, vol. 3, No. 12, 2003, pp. 1677-1681.

Talapin, D. V., et al., "Seeded Growth of Highly Luminescent CdSe/CdS Nanoheterostructures with Rod and Tetrapod Morphologies", Nano Letters, vol. 7, No. 10, 2007, pp. 2951-2959.

Xie, R., et al., "Colloidal InP Nanocrystals as Efficient Emitters Covering Blue to Near-Infrared"; J. Am. Chem. Soc., 129 (50), Nov. 23, 2007, pp. 15432-15433.

Yu, W. W., et al., "Experimental Determination of the Extinction Coefficient of CdTe, CdSe, and CdS Nanocrystals," Chem. Mater., 15, 2003, pp. 2854-2860.

Zhelev, Z. et al., "Single Quantum Dot-Micelles Coated with Silica Shell as Potentially Non-Cytotoxic Fluorescent Cell Tracers"; J. Am. Chem. Soc., vol. 128 (19), Apr. 21, 2006, pp. 6324-6325.

Zhu, M.-Q., et al., "CdSe/CdS/SiO2 Core/Shell/Shell Nanoparticles," Journal of Nanoscience and Nanotechnology, vol. 7, 2007, pp. 2343-2348.

Zou, Hua, et al., "Polymer/Silica Nanocomposites: Preparation, Characterization, Properties, and Applications," Chem. Rev. vol. 108, No. 9, 2008, pp. 3893-3957.

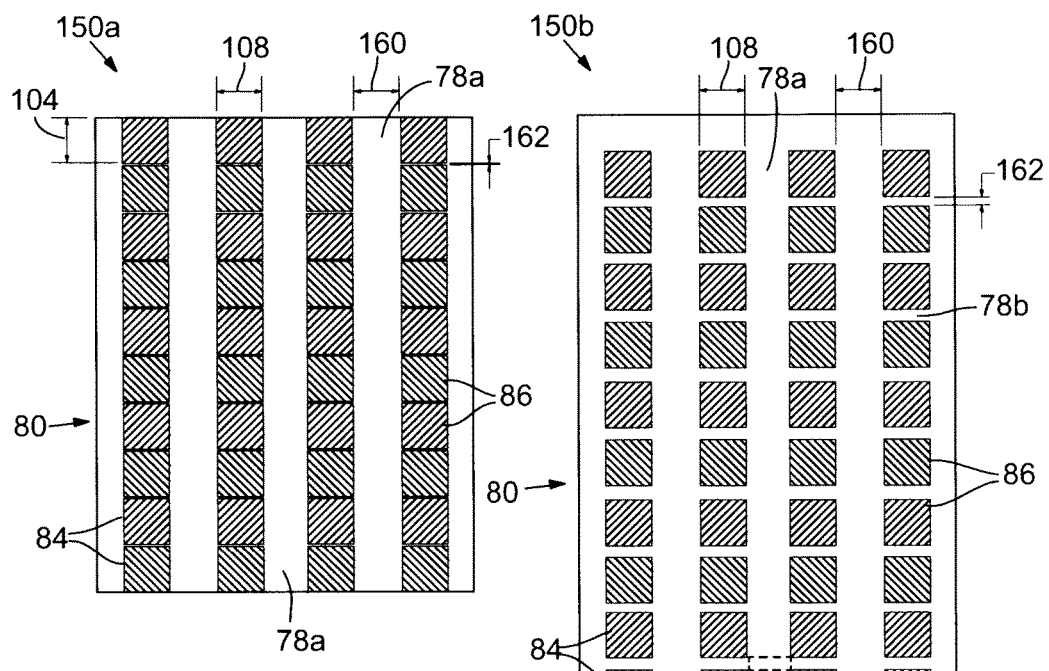

QUANTUM DOT AND LUMINESCENT MATERIAL MADE THEREFROM

COPYRIGHT NOTICE

© 2011 Spectrawatt, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

RELATED APPLICATION

This application is a continuation of and claims the benefit of U.S. patent application Ser. No. 13/287,407, filed Nov. 5, 2011, and issued on Dec. 20, 2016 as U.S. Pat. No. 9,525,092, which claims the benefit under 35 U.S.C. § 119(e) of U.S. Provisional Patent Application No. 61/410,754, filed Nov. 5, 2010, the entire contents of which are incorporated herein by reference.

TECHNICAL FIELD

This disclosure relates to solar modules and, in particular, to a solar module employing a luminescent concentrator material.

BACKGROUND INFORMATION

The cost of electricity from relatively efficient solar cells in a module is still higher in dollar per watt than most currently available retail peak electricity rates. The conventional wisdom is that cost of electricity per watt generated by a solar cell can generally be changed in either of two ways: the light conversion efficiency of the solar cell can be increased, or the cost of producing the solar cell can be decreased. More efficient or less expensive solar components in modules are, therefore, desirable.

SUMMARY OF THE DISCLOSURE

The cost per watt generated by a solar module can be reduced by use of a luminescent concentrator material.

In some embodiments, the percentage of surface area of photovoltaic material in a solar module can be reduced by employing luminescent concentrator material for some of the surface area of the solar module.

In some alternative or cumulative embodiments, the surface area of the photovoltaic material is generally parallel to a charge carrier junction plane within the photovoltaic material and generally covers 43 to 91% of the surface area of the solar module.

In some alternative or cumulative embodiments, the surface area of luminescent concentrator material generally covers 2 to 50% of the surface area of the solar module.

In some alternative or cumulative embodiments, the luminescent concentrator material is positioned between photovoltaic cells of relatively efficient photovoltaic material to reduce the amount and cost of photovoltaic material employed in a solar module.

In some alternative or cumulative embodiments, the photovoltaic cells employ wafer-based photovoltaic materials.

In some alternative or cumulative embodiments, the wafer-based photovoltaic materials include microcrystalline silicon.

In some alternative or cumulative embodiments, the luminescent concentrator material includes quantum dot heterostructures.

Additional aspects and advantages will be apparent from the following detailed description of preferred embodiments, which proceeds with reference to the accompanying drawings.

BRIEF DESCRIPTION OF THE DRAWINGS

FIG. 5A is a plan view of an exemplary layout of the surface areas of photovoltaic material and luminescent concentrator material in an exemplary luminescent lateral transfer concentrator module.

FIG. 5B is a plan view of an alternative layout of the surface areas of photovoltaic material and luminescent concentrator material in an exemplary luminescent lateral transfer concentrator module.

DETAILED DESCRIPTION OF PREFERRED EMBODIMENTS

Figure 1:
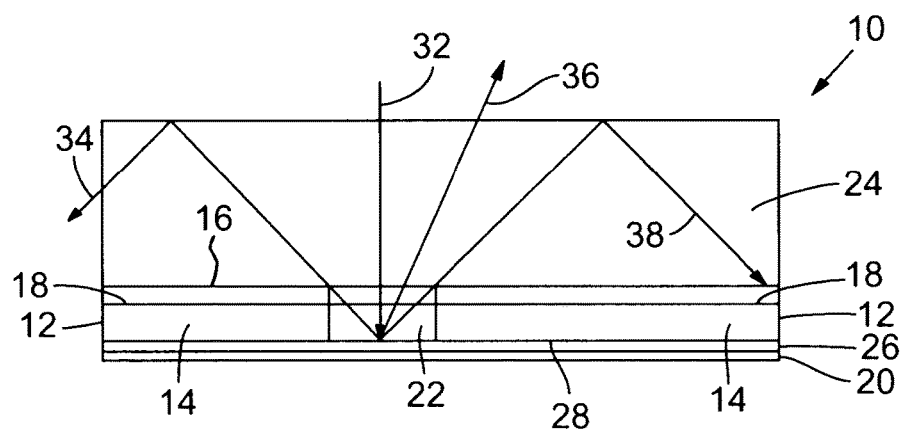
FIG. 1 is a sectional side view of a portion of a standard solar module employing photovoltaic material with its large-area surface dimension oriented parallel to a bottom layer material.

FIG. 1 is a sectional side view of a portion of a standard solar module 10 formed of photovoltaic cells 12 employing photovoltaic material 14 with its front, top, or sun-facing surface 16 oriented to be parallel to a junction plane of its charge-carrier separation junction 18. With reference to FIG. 1, the front surfaces 16 have the large-area surface dimensions of the photovoltaic cells 12 and have a front surface plane that is generally parallel to a back plane of a back protective layer 20. The photovoltaic cells 12 are space-apart with intercell areas 22 being filled with air between the regions of the photovoltaic material 14. In a standard 60-cell solar module 10, the photovoltaic material 14 occupies at least 91% of the surface area, the intercell area occupies about 2% of the surface area, and the aluminum frame occupies about 7% of the surface area of the standard solar module 10. The photovoltaic material 14 and the intercell area 22 are typically covered by a front transparent protective layer 24, such as a sheet of glass.

Many of the photons 32 incident upon the intercell area 22 are reflected out of the solar module 10 along exemplary reflection paths 34 and 36. Only a limited number of photons 32 incident upon the intercell area 22 are reflected internally in a manner, such as along exemplary reflection path 38, in which they can be absorbed by the photovoltaic material 14. Most of the photons 32 incident upon the intercell area 22 are reflected out of the solar module 10.

In some standard solar modules 10, internal reflection is improved by employing a layer of reflective material 26 above or beneath the back protective layer 20. A commonly employed reflective material 26 is white Tedlar™, which is able to scatter approximately 20% of the photons 32 that hit it into the photovoltaic material 14 from both its front surface 16 and rear surface 28 by total internal reflection (TIR). For a front transparent protective layer 24 above Tedlar™, 25.6% of that 20% of the light that does scatter is below the critical angle for TIR. TIR occurs when light inside a medium of index of refraction, $n_2$, hits an interface with a medium of index of refraction, $n_1$, at an angle further from normal than the critical angle. The critical angle is defined as $\theta=\arcsin(n_1/n_2)$. For the case of glass to air, this angle is 41.8°.

Figure 2:
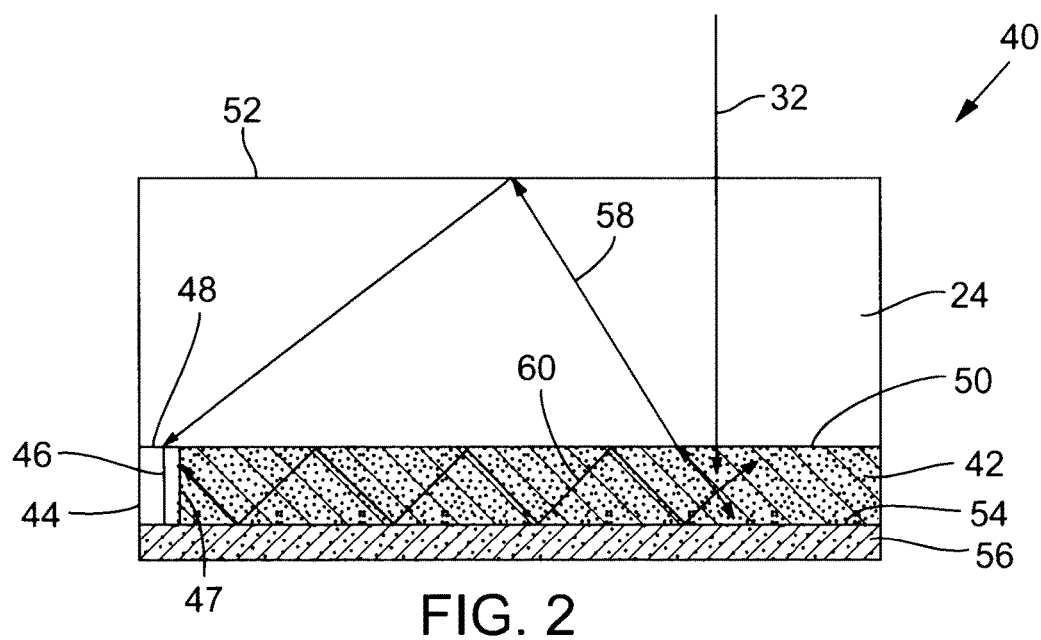
FIG. 2 is a sectional side view of a portion of a luminescent solar concentrator module employing luminescent concentrator material and a strip of photovoltaic material with its junction plane oriented perpendicular to the sun-facing surface of the luminescent solar concentrator module.

FIG. 2 is a sectional side view of a portion of a luminescent solar concentrator (LSC) module 40 employing luminescent concentrator material 42 and a strip of highly efficient photovoltaic material 44 oriented so that its junction plane 46 and its junction-parallel surface 47 are perpendicular to a front or sun-facing surface 48 of the photovoltaic material 44, perpendicular to a front or sun-facing surface 50 of the luminescent concentrator material 42, perpendicular to a front or sun-facing surface 52 of the luminescent solar concentrator module 40, and perpendicular to a front or sun-facing surface 54 a bottom layer material 56. With reference to FIG. 2, the luminescent concentrator material 42 may reflect a greater percentage (with respect to air) of incident photons 32 along exemplary reflection paths 58 and 60.

The strips of photovoltaic material 44 in a luminescent solar concentrator module 40 are 1 to 2 mm in width and 1 to 100 cm in length. The luminescent concentrator material 42 occupy regions that range between 1 and 10 cm in width. If one assumes standard kerf losses of 50% of the photovoltaic material 44, then 0.1 to 1 $m^2$ of photovoltaic material 44 per $m^2$ of luminescent solar concentrator module 40.

Because the relative amount of photovoltaic material 44 is small, causing the relative amount of the sun-facing surface 48 and the junction-parallel surface 47 to have little relative surface area (typically less than 10%), the luminescent solar concentrator module 40 is useful only when highly efficient photovoltaic material 44 such as InGaP is employed. Unfortunately, high volume production costs for InGaP cells are still in the neighborhood of $40,000/$m^2$, which is prohibitively expensive at a practical concentration for most practical applications. The InGaP cells are sliced into strips, rotated perpendicular to the incident sunlight, and glued onto the side of the luminescent material 42. The slicing and gluing steps also add manufacturing complications and reduce yield.

Figure 3:
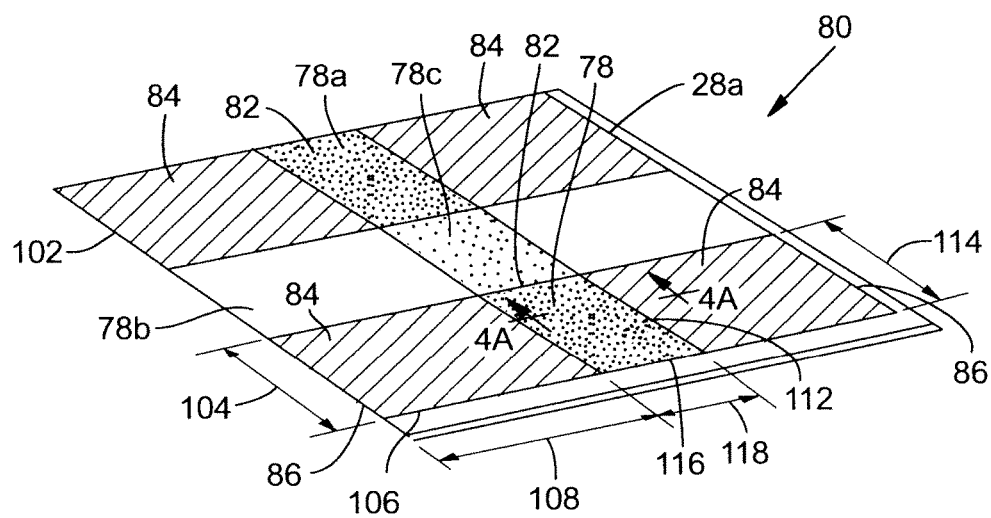
FIG. 3 is an isometric view of a luminescent lateral transfer solar concentrator module employing a luminescent concentrator material between spaced-apart areas of photovoltaic material having its junction plane oriented parallel to the front surface of the quantum luminescent solar concentrator module.
Figure 4A:
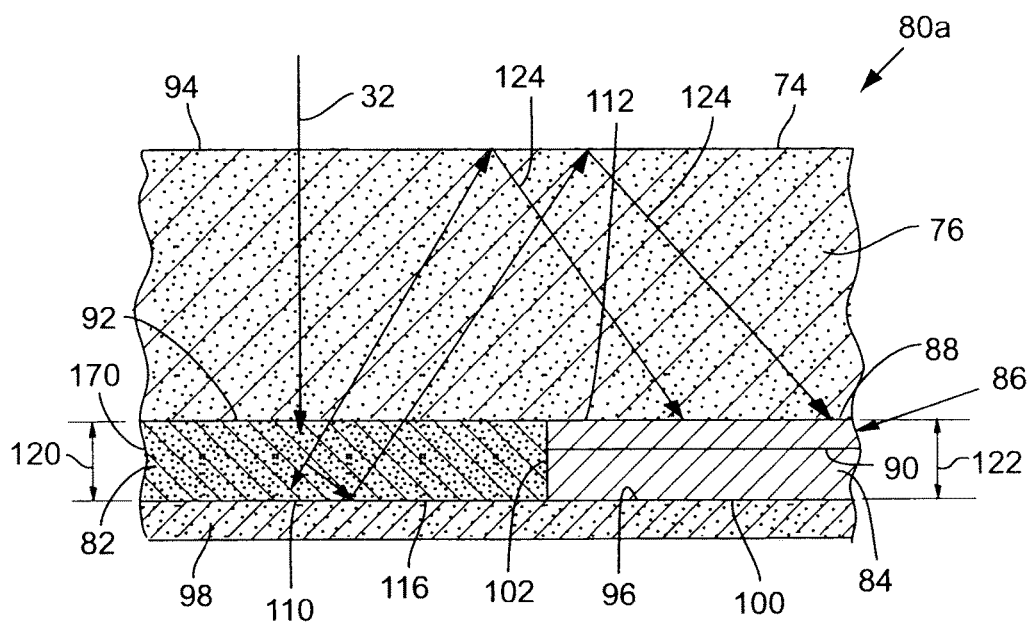
FIG. 4A is a sectional side view of a portion of a luminescent lateral transfer solar concentrator module of FIG. 3 showing a luminescent concentrator material having a height dimension that is the same as a height dimension of the photovoltaic material with respect to the bottom layer material.

FIG. 3 is an isometric view of an exemplary luminescent lateral transfer (LLT) solar concentrator module 80 employing a luminescent concentrator material 82 between spaced-apart areas of photovoltaic material 84 of the photovoltaic cells 86. FIG. 4A is a sectional side view of a portion of a luminescent lateral transfer solar concentrator module 80 (shown as 80a in FIG. 4A) taken along lines 4A-4A of FIG. 3. With reference to FIGS. 3 and 4A, the photovoltaic material 84 of the photovoltaic cells 86 has a front, top, or sun-facing surface 88 that is oriented to be generally parallel to a junction plane of its charge-carrier separation junction 90. Examples of charge-carrier separation junction 90 include, but are not limited to, pn, pin or nip junctions.

The front or sun-facing surface 88 is also generally parallel to a front or sun-facing surface 74 of a front or sun-facing transparent protective layer 76 such as a sheet of glass, generally parallel to a front or sun-facing surface 92 of the luminescent concentrator material 82, generally parallel to a front or sun-facing surface 94 of the luminescent lateral transfer solar concentrator module 80, and generally parallel to a front or sun-facing surface 96 of a bottom layer material 98.

The front surface 88 and an opposing back, rear, bottom, or earth-facing surface 100 of the photovoltaic material 84 constitute major surfaces of the photovoltaic material 84. The photovoltaic material 84 also has width-related surfaces 102 that have a width dimension 104 and length-related surfaces 106 that have a length dimension 108. The width dimension 104 and the length dimension 108 are typically different; however, if the front surface 88 has a square surface area, then the dimensions 104 and 108 can be generally the same. In some implementations, the width dimension 104 and the length dimension 108 both have the same or different values greater than 2 mm, 5 mm, 10 mm, 25 mm, 50 mm, 100 mm, or 150 mm.

The width-related surfaces 102 and the length-related surfaces 106 have surface areas that are smaller than the surface area of the front surface 88 and constitute minor surfaces of the photovoltaic material 84. In many implementations, the photovoltaic cells 86 have the same surface areas and the same width and length dimensions 104 and 108 of photovoltaic material 84; however, photovoltaic cells 86 with different dimensions can be employed.

The front or sun-facing surface 92 and an opposing back, rear, bottom, or earth-facing surface 110 of an intercell region 78 of the luminescent concentrator material 82 constitute major surfaces of the region 78 of the luminescent concentrator material 82. The region 78 of the luminescent concentrator material 82 also has width-related surfaces 112 that have a width dimension 114 and length-related surfaces 116 that have a length dimension 118. In many implementations, the width dimensions 104 and 114 are the same but the length dimensions 108 and 118 are different. The width dimension 114 and the length dimension 118 are typically different; however, if the front surface 92 has a square surface area, then the dimensions 114 and 118 can be generally the same. The width-related surfaces 112 and the length-related surfaces 116 have surface areas that are smaller than the surface area of the front surface 92 and constitute minor surfaces of the luminescent concentrator material 82.

In many implementations, the regions 78 of the luminescent concentrator material 82 have the same surface areas and the same width and length dimensions 114 and 118 of luminescent concentrator material 82; however, regions 78 of luminescent concentrator material 82 with different dimensions can be employed. For example, intercell regions 78a between width-related surfaces 102 of opposing photovoltaic cells 86 may have one or more different dimensions than intercell regions 78b between length-related surfaces 106 of opposing photovoltaic cells 86. Similarly, intercell regions 78c that connect intercell regions 78a and 78b may have one or more different dimensions than each other or one or more different dimensions than those of intercell regions 78a and 78b.

The luminescent concentrator material 82 has a height dimension 120 that may be the same as or different from a height dimension 122 of the photovoltaic material 84. In some implementations, the height dimension 120 of the luminescent concentrator material 82 is between 1 and 1000 microns. In some implementations, the height dimension 120 of the luminescent concentrator material 82 is between 200 and 900 microns, 300 and 800 microns, or 400 and 700 microns. In some implementations, the range of height dimensions 120 matches the absorption range of the luminescent concentrator material 82.

Figure 4B:
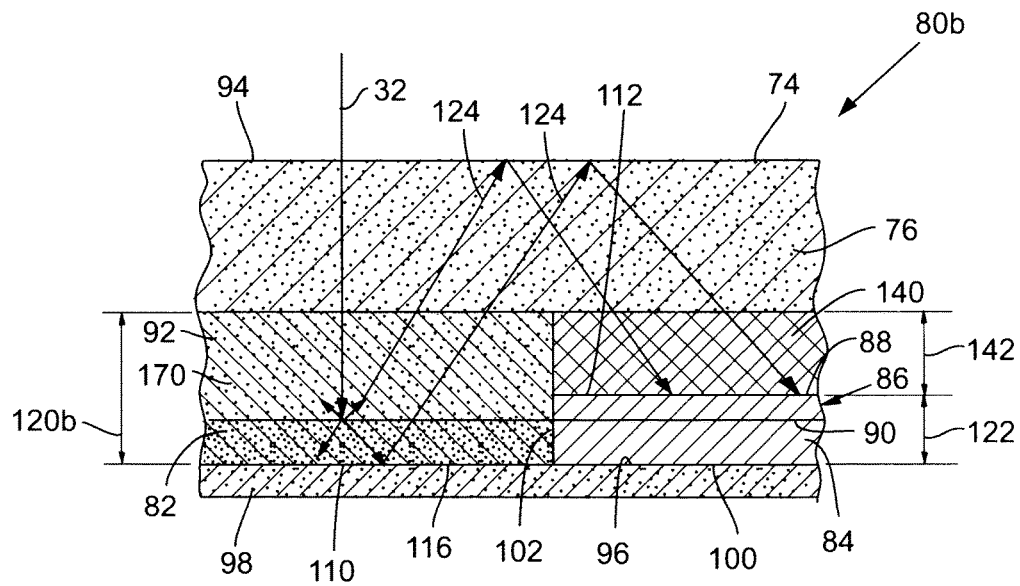
FIG. 4B is a sectional side view of a portion of an alternative luminescent lateral transfer solar concentrator module showing a luminescent concentrator material having a height dimension that is greater than a height dimension of the photovoltaic material with respect to the bottom layer material.
Figure 4C:
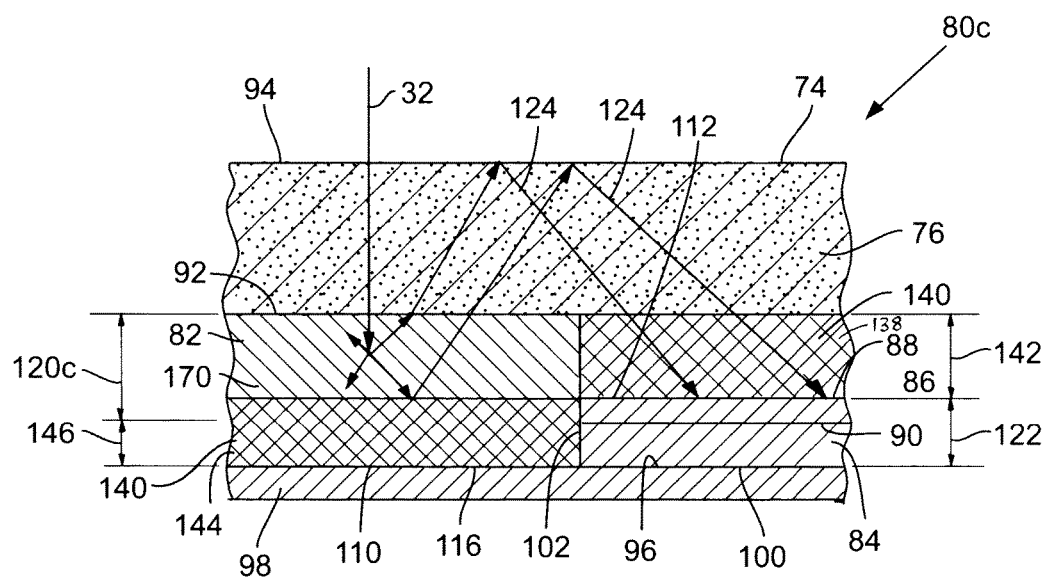
FIG. 4C is a sectional side view of a portion of an alternative luminescent lateral transfer solar concentrator module showing the luminescent concentrator material positioned at level only above the front surface of the photovoltaic material.
Figure 4D:
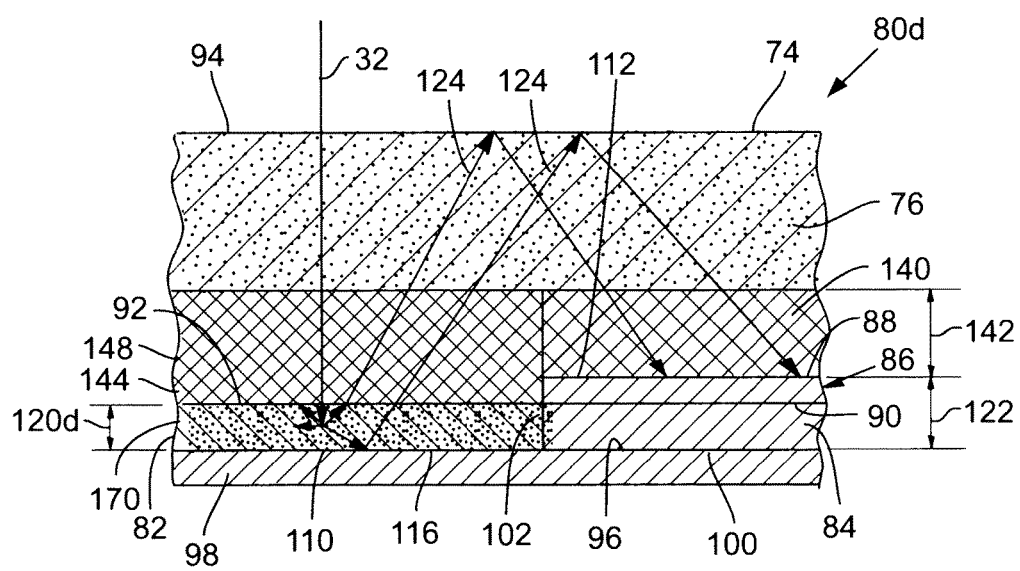
FIG. 4D is a sectional side view of a portion of another alternative luminescent lateral transfer solar concentrator module showing the luminescent concentrator material positioned at a level only below a front surface of the photovoltaic material.

FIGS. 4B, 4C, and 4D are sectional side views of portions of respective alternative exemplary implementations of luminescent lateral transfer solar concentrator modules 80b, 80c, and 80d. With reference to FIG. 4B, the luminescent concentrator material 82 of the luminescent lateral transfer solar concentrator modules 80b has a height dimension 120b that is greater than the height dimension 122 of the photovoltaic material 84.

A spacer material 140 may be employed to occupy the volume 138 between the bottom of protective layer 76 and the front surface 88 of the photovoltaic material 84, i.e., the spacer material 140 may have a height dimension 142 that is the difference between the height dimension 120b and the height dimension 122 of the photovoltaic material 84. The spacer material 140 may have length and width dimensions that match those of the photovoltaic material 84. In some implementations, the spacer material is a transparent protective material employed to safeguard the photovoltaic material 84 without interfering with it light absorbing function, and it may be the same or different material as that optionally used to encapsulate the entire luminescent lateral transfer solar concentrator module 80. In some implementations, the luminescent concentrator material 82 may be used as the spacer material 140 to fill the volume 138, with or without a layer of spacer material 140 positioned between the protective layer 76 and the luminescent concentrator material 82.

With reference to FIG. 4C, the luminescent concentrator material 82 of the luminescent lateral transfer solar concentrator modules 80c is positioned at a level above the front surface 88 of the photovoltaic material 84 but adjacent to the plane of its side surface 102. The volume 138 may include the spacer material 140, or the volume 138 may include the luminescent concentrator material 82 so that a an optionally uniform sheet of luminescent concentrator material 82 covers both the intercell areas 78 and the photovoltaic material 84. A spacer material 140 may be employed to occupy a volume 144 between the bottom surface of luminescent concentrator material 82 in region 78 and the front surface 96 of the bottom layer material 98, i.e., the spacer material 140 may have a height dimension 146 that is the same height dimension 122 of the photovoltaic material 84.

With reference to FIG. 4D, the luminescent concentrator material 82 of the luminescent lateral transfer solar concentrator modules 80d is positioned in the intercell areas 78 but at a height dimension 120d that is less than or equal to the height dimension 122 of the photovoltaic material 84. The volume 144 may be filled with an spacer material 148 that may be the same as or different from the spacer material 140.

FIGS. 5A and 5B are plan views of exemplary alternative layouts 150a and 150b of exemplary luminescent lateral transfer concentrator modules 80. With reference to FIGS. 5A and 5B, the photovoltaic cells 86 are shown to be relatively square in shape and have an exemplary front surface 88 with a length dimension 108 of 156 mm. However, the width dimensions 104 and the length dimensions 108 need not be the same and can be any standard or nonstandard size. For example, the dimensions may be consistent with those of a standard mc-Si photovoltaic cells or a standard CIGS photovoltaic cells 86. In some implementations, the photovoltaic cells 86 may have nonrectangular surface areas, such as circular. Such nonrectangular surface areas may be represented by the diameter, radius, or other major dimensions.

In some implementations, the cumulative exposed surface area of the front surfaces 88 can range between 43% and 91% of the total front surface area of the luminescent lateral transfer concentrator modules 80. In some implementations, the cumulative exposed surface area of the front surfaces 88 can range between 43% and 75% of the total front surface area of the luminescent lateral transfer concentrator modules 80. In some implementations, the cumulative exposed surface area of the front surfaces 88 can range between 43% and 55% of the total front surface area of the luminescent lateral transfer concentrator modules 80. In some implementations, the cumulative exposed surface area of the front surfaces 88 is less than 50% of the total front surface area of the luminescent lateral transfer concentrator modules 80.

In some implementations, the cumulative exposed surface area of the front surfaces 88 can range between 55% and 91% of the total front surface area of the luminescent lateral transfer concentrator modules 80. In some implementations, the cumulative exposed surface area of the front surfaces 88 can range between 75% and 91% of the total front surface area of the luminescent lateral transfer concentrator modules 80. In some implementations, the cumulative exposed surface area of the front surfaces 88 is greater than 50% of the total front surface area of the luminescent lateral transfer concentrator modules 80.

In some implementations, the cumulative exposed surface area of the front surfaces 88 can range between 50% and 80% of the total front surface area of the luminescent lateral transfer concentrator modules 80. In some implementations, the cumulative exposed surface area of the front surfaces 88 can range between 55% and 75% of the total front surface area of the luminescent lateral transfer concentrator modules 80.

The dimensions of the intercell areas 78 (78a, 78b, and 78c) can also be diverse. The intercell areas 78a are shown in layouts 150a and 150b to have length dimensions 160 that are the same; however, the intercell areas 78a are shown to have different width dimensions 162. The length dimensions 160 and the width dimensions 162 of the intercell area 78a can range between 2 mm and 20 cm, independently. In some implementations, the length dimensions 160 and/or the width dimensions 162 can range between 2 mm and 10 cm, 2 mm and 500 mm, 2 mm and 100 mm, 2 mm and 50 mm, 2 mm and 10 mm, 2 mm and 6 mm, or 2 mm and 4 mm. The length dimensions 160 can fall in different ranges than the width dimensions 162.

In some implementations, the total intercell areas 78 can occupy from 2% (just filling in the "dead-space" in a standard module) up to 50% of the surface area of the luminescent lateral transfer concentrator module 80. Thus, if the luminescent concentrator material 82 occupies only intercell areas 78, then the luminescent concentrator material 82 covers from 2 to 50% of the surface area of the luminescent lateral transfer concentrator module 80. In some implementations, the surface area of the luminescent lateral transfer concentrator module 80 is occupied by total intercell areas 78 of 2 to 40%, 2 to 25%, 2 to 10%, 2 to 5%, 5 to 50%, 10 to 50%, 25 to 50%, 40 to 50%, or 25 to 40%.

In some implementations, the luminescent concentrator material 82 occupies the total intercell areas 78 by 50 to 100%, 65 to 100%, 80 to 100%, 90 to 100%, 50 to 75%, or 65 to 80%. If the luminescent concentrator material 82 overlays the photovoltaic material 84, then the luminescent concentrator material 82 can cover up to 100% of the surface area of the luminescent lateral transfer concentrator module 80. The luminescent concentrator material 82 may occupy any area dimensions at the periphery of the luminescent lateral transfer concentrator module 80.

The photovoltaic material 84 used in the photovoltaic cells 86 can include, but is not limited to, one or more of: a-Si (amorphous silicon), c-Si (crystalline silicon), mc-Si, thin-film Si, $Al_xGa_{1-x}As$, $Al_xGa_{1-x}As_yN_{1-y}$, CdSe, CdS, CdZnTe, $CuAlSe_2$, $CuGaS_2$, $CuGaSe_2$, $CuInAlSe_2$, $CuIn_xGa_{1-x}S_{(y)2}Se_{(1-y)2}$, $CuIn_xGa_{1-x}Se_2$, $CuIn_{1-x}Ga_xSe_{2-y}S_y$, $CuInS_2$, $CuInSe_2$, CuO, $CuZn_xSn_{1-x}S_2$, $CuZn_xSn_{1-x}Se_2$, GaAs, $Ga_xIn_{1-x}As$, $Ga_xIn_{1-x}As_yN_{1-y}$, $Ga_xIn_{1-x}P$, $In_xGa_{1-x}N$, InP, $InP_xN_{1-x}$, $Zn_3P_2$, and ZnSe. In some embodiments, the photovoltaic material 84 may employ quantum dot heterostructure materials as disclosed in detail in U.S. patent application Ser. No. 12/606,908, entitled Solar Cell Constructed with Inorganic Quantum Dots and Structured Molecular Contacts, which is herein incorporated by reference. In preferred implementations, low-cost, well-established, and/or easily produced photovoltaic material 84, such as silicon-based photovoltaic materials 84 are employed. In some implementations, wafer-based Si (multicrystalline, ribbon, and crystalline) photovoltaic cells 86 are preferred, or cell based thin-film solar cells (having a "substrate configuration") including, but not limited to, copper indium gallium diselenide, copper indium gallium disulfide, copper indium disulfide, copper gallium diselenide, or any alloys of these are preferred. In some implementations, standard c-silicon or mc-silicon photovoltaic cells 86 are most preferred. The photovoltaic cells 86 may be wired together in series and/or parallel.

In preferred implementations, the luminescent concentrator material 82 includes luminescent chromophores dispersed in a transparent matrix material 170. The transparent matrix material 170 preferably has an index of refraction of n=1.1 to 3. In more preferred implementations, the transparent matrix material 170 has an index of refraction of n=1.5 to 2. The transparent matrix material 170 may employ the same material as, or different materials from, the spacer materials 140 and 148.

With reference again to FIGS. 4A, 4B, 4C, and 4D (collectively FIG. 4), photons 32 of light incident on the luminescent concentrator material 82 are absorbed by the chromophores, re-emitted and ultimately directed via TIR along reflected pathways 124 to the photovoltaic cells 86 on either side of the luminescent concentrator material 82. The luminescent chromophores can be either organic dyes or nanomaterials, such as quantum dot heterostructures (QDHs) as described later in greater detail. In some implementations, chromophores with inherently high photoluminescence quantum yield (80% or above) are selected. In some implementations, the chromophores have a photoluminescence quantum yield of greater than 90%, greater than 95%, greater than 97%, or greater than 99%. In some implementations, the chromophores are selected to have minimal overlap between emission and absorption spectra to reduce or avoid re-absorption and another chance for loss by non-radiative recombination or lost emission at an angle exceeding the critical angle for TIR. Snell's law predicts that 75% of emitted light will be internally reflected for materials with an index of refraction of ~1.5, which is typical for glass and some solar cell encapsulants. In some implementations of luminescent lateral transfer concentrator modules 80 employing quantum dot hetero structures, as later described, only 12.8% of the incident light is below the critical angle for TIR.

The transparent matrix material 170 may include solar cell encapsulants, such as ethyl-vinyl acetate, polyvinylbutyral, polydimethyl siloxane, methacrylate polymers, cyclic olefin copolymers, may include metal oxides, such as $TiO_x$, $ZrO_x$, $SiO_x$, $ZnO_x$, etc., or may include both. The transparent matrix material 170 could be any of these or chemically modified versions of them (more or less OH groups, longer or shorter aliphatic solubilizing agents, etc.).

Organic dye chromophores include, but are not limited to, perylene or one of its derivatives, coumarin 6, and rhodamine or one of its derivatives. In some implementations, the organic dye chromophore may be any dye with a photoluminescent quantum yield above 90% and a Stokes' shift above 50 nm.

Nanomaterials are highly suitable for use as the chromophores and offer serious advantages over dyes. The nanomaterials are solution processible, highly controllable semiconductor nanostructures synthesized by low-cost solution-based methods and can be made to have the exact optical properties desired for the chromophores. Because of their unique structure and composition, nanomaterials can be more stable than dyes. For example, the nanomaterials can be more reliable and provide more predictable and precise absorption spectra.

Nanomaterials, such as semiconductor nanocrystals, are materials with at least one nano-scale dimension, are most often grown colloidally, and have been made in the form of dots, rods, tetrapods, and even more exotic structures. (See Scher, E. C.; Manna, L.; Alivisatos, A. P. *Philosophical Transactions of the Royal Society of London. Series A: Mathematical, Physical and Engineering Sciences* 2003, 361, 241 and Manna, L.; Milliron, D. J.; Meisel, A.; Scher, E. C.; Alivisatos, A. P. *Nat Mater* 2003, 2, 382-385.) Their sizes generally range from 3 nm to 500 nm. Due to the quantum size effects which arise from a material having dimensions on the order their electron's bohr radius, the bandgap of the material can also be tuned (See Alivisatos, A. P. *J. Phys. Chem.* 1996, 100, 13226-13239 and Bawendi, M. G.; Steigerwald, M. L.; Brus, L. E. *Annual Review of Physical Chemistry* 1990, 41, 477-496.) In addition to facilitating tunability of the bandgap for absorption and emission, the nanomaterials have near perfect crystallinity, allowing them to attain extremely high photoluminescence (See Talapin, D. V.; Nelson, J. H.; Shevchenko, E. V.; Aloni, S.; Sadtler, B.; Alivisatos, A. P. *Nano Lett.* 2007, 7, 2951-2959 and Xie, R.; Battaglia, D.; Peng, X. *J. Am. Chem. Soc.* 2007, 129, 15432-15433.)

In some implementations, the chromophores include nanomaterials, particularly nanocrystals such as quantum dot heterostructures. Quantum dot heterostructures are a form of nanomaterial engineered for a specific application, such as absorption and emission, or downshifting in particular. In some implementations, the chromophores include encapsulated quantum dot heterostructures. In some implementations, the chromophores include quantum dot heterostructures, encapsulated discretely by secondary materials through a micelle approach.

Figure 6:
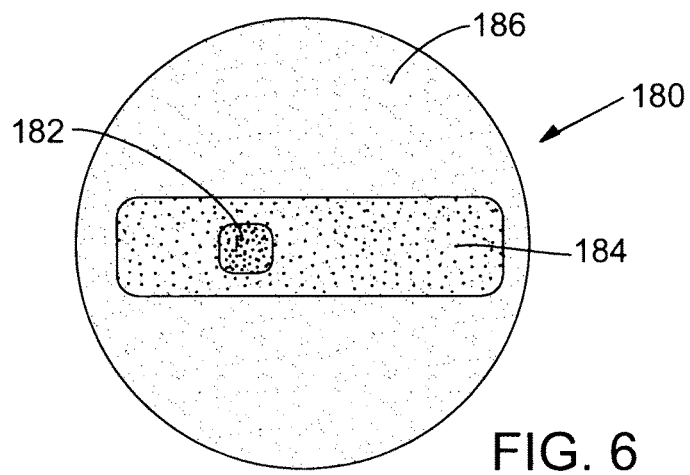
FIG. 6 is simplified enlarged drawing of an encapsulated quantum dot heterostructure.

FIG. 6 is an exemplary simplified enlarged drawing of an encapsulated quantum dot heterostructure 180. With reference to FIG. 6, an encapsulated quantum dot heterostructure 180 includes a quantum dot heterostructure 180 having a core 182 surrounded by one or more shells 184. The shell 184 is further encapsulated by an encapsulating material 186.

By discretely encapsulating each quantum dot heterostructure 180 individually, it is possible to homogeneously disperse the quantum dot heterostructures 180 in a transparent matrix material 170, as well as protect the surface of the quantum dot heterostructures 180 from the external environment. Therefore, the use of the encapsulating materials 186 greatly helps to both passivate surface defects of the quantum dot heterostructures and isolate the individual quantum dot heterostructures 180 for better dispersion. Thus, the encapsulating materials 186 minimize the interaction among the quantum dot heterostructures 180, improving the stability as well as the homogeneity in the transparent matrix material 170. In some implementations, the encapsulating materials 186 may be the same as the transparent matrix material 170 or they may be derivatives of each other, or they may be different materials. Good physical absorption between the materials 170 and 186 are desirable to reduce the possibility of delamination.

The outer encapsulating materials 186 can be grown on individual quantum dot heterostructures 180 non-epitaxially. Micelles are formed using a pair of polar and non-polar solvents in the presence of a compatible surfactant. The surface polarity of a quantum dot heterostructure 180 can be modified so that only a single quantum dot heterostructure 180 will reside in an individual micelle. By adding additional precursors, an inorganic or organic polymeric casing of encapsulating material 186 can be selectively grown on the quantum dot heterostructure 180 inside of the micelle, which acts as a spherical template. (See Selvan, S. T.; Tan, T. T.; Ying, J. Y. *Adv. Mater.*, 2005, 17, 1620-1625; Zhelev, Z.; Ohba, H.; Bakalova, R. *J. Am. Chem. Soc.,* 2006, 128, 6324-6325; and Qian, L.; Bera, D.; Tseng, T.-K.; Holloway, P. H. *Appl. Phys. Lett.*, 2009, 94, 073112.)

Thus, by tuning the synthetic conditions, a single nanocrystal 180 can be discretely incorporated in a silica sphere as shown in FIG. 6. Throughout the encapsulation process, the nanocrystal surfaces are well passivated to avoid any aggregation problems. Additionally, this passivation endows the quantum dot heterostructures 180 with photoluminescence quantum yields of and near unity. For the quantum dot heterostructures 180, the matrix compatibility can be dependent on the surface of the encapsulating sphere, not the nanocrystal 180. Since the surface of the encapsulating material 186 is spatially removed from the nanocrystal surface, alterations to the exterior of the encapsulating material 186 do not adversely affect the electronic or optical properties of the nanocrystal.

Semiconductor nanocrystals, such as cadmium selenide or indium phosphide, have widely been studied for control over both their composition and shape. (See Scher, E. C.; Manna, L.; Alivisatos, A. P. *Philosophical Transactions of the Royal Society of London. Series A: Mathematical, Physical and Engineering Sciences* 2003, 361, 241 and Talapin, D. V.; Rogach, A. L.; Shevchenko, E. V.; Kornowski, A.; Haase, M.; Weller, H. *J. Am. Chem. Soc* 2002, 124, 5782-5790.)

Thus, in addition to spherically-shaped nanostructures, various non-spherical nanostructures have been demonstrated including, but not limited to, nanorods, nanotetrapods, and nanosheets. Non-spherical semiconductor quantum dot heterostructures 180 have different unique physical and electronic properties from those of spherical semiconductor nanocrystals. These properties can be employed advantageously in the luminescent concentrator material 82.

In some embodiments, the luminescent concentrator material 82 may include individually encapsulated quantum dot heterostructures 180 employing one type of core material, one type (composition) of shell material, and one shape of shell material. In some embodiments, the luminescent concentrator material 82 may include individually encapsulated quantum dot heterostructures employing two or more varieties of individually encapsulated quantum dot heterostructures, such as a first type of individually encapsulated quantum dot heterostructure employing a first type of core material, a first type of shell material, and a first shape of shell material and a second type of individually encapsulated quantum dot heterostructure employing the first type of core material, the first type of shell material, and at least one or more different shapes of shell material, such as rods and tetrapods.

In some embodiments, the second type of individually encapsulated quantum dot heterostructure employs a first type of core material, at least one or more different types of shell material, such as ZnS or CdS, and the first or at least one or more different shapes of shell materials. In such embodiments, each shell material may be associated with a specific shape, or each shell material may be formed with a plurality of shapes. In some embodiments, the second type individually encapsulated quantum dot heterostructures employs at least one or more different types of core materials, the first or one or more different types of shell materials, and the first or one or more different types of shell shapes. In such embodiments, each core material may be associated with specific shell materials and/or shapes, or each core material may be associated with one or more shell materials and/or shapes.

In some examples, the luminescent concentrator material 82 includes quantum dot heterostructures having CdSe dot cores 182 with a rod-shaped CdS shells 184, encapsulated in a silica encapsulating material 186. This quantum dot material exhibits maximum absorption at wavelengths shorter than 500 nm and maximum emission at wavelengths between 550-700 nm. In some examples, a CdS extended shell 184 is covered by a layer of organic aliphatic ligands, with or without a silica encapsulating material 186. In some examples, an oxide layer is positioned between the CdS extended shell 184 and the organic ligands. In some implementations, the CdSe dot core 182 has no physical dimension greater than 6 nm, while the CdS extended shell 184 has at least one dimension greater than 15 nm and a second dimension about 1-2 nm thicker than the dimension of the CdSe dot core 182. In some implementations, the oxide shell can range between 1 and 50 nm in radius (excluding the dimensions of the CdSe dot cores 182 and the CdS extended shell 184. In some implementations, the ratio of shell volume to core volume falls between 1 and 1000, 1 and 500, 1 and 100, 1 and 50, 1 and 20, 2 and 20, 2 and 50, 2 and 100, 2 and 500, 5 and 500, 10 and 500, or 10 and 100. In some preferred implementations, the ratio falls between 15 and 60. These variations and dimensional ranges may apply to other combinations of dot cores 182, shells 184, and encapsulating materials 186.

In some embodiments, the quantum dot heterostructures can include one or more of the following inorganic compounds and/or any combination of alloys between them: CdSe, CdS, CdTe, ZnSe, ZnS, ZnTe, $CuS_2$, $CuSe_2$, $In_2S_3$, $In_2Se_3$, $CuGaSe_2$, $CuGaS_2$, $CuInS_2$, $CuInSe_2$, PbSe, PbS, $SiO_2$, $TiO_2$, ZnO, ZrO. These materials can be arranged in cores 182, core-shells, and core-shell-shells, with or without organic ligands, such as phosphonic acids, carboxylic acids, or amines. Any of these combinations can be implemented in any of the above-disclosed spatial configurations and dimensions of luminescent concentrator material 82 and in combination with any of the disclosed photovoltaic materials 84.

Some examples of preferred core/shell combinations include, but are not limited to, CdSe/CdS, CdSe/ZnS, InP/ZnS, and CuInSe/ZnS. In general, quantum dot heterostructures based on the II-VI chalcogenides are high efficiency emitters. In particular, quantum dot heterostructures including CdSe, CdSe/ZnS, CdSe/CdS, or CdTe provide very high luminescence. In solution, these quantum dot heterostructure particles have shown quantum efficiencies of greater than 90%, often as high as 95%, and up to unity.

In some implementations, these quantum dot heterostructures have an absorption cut-off of 500 nm and high extinction coefficients ($10^7$ $mol^{-1}$ $cm^{-1}$ at 340 nm). In some implementations, the optical properties of the quantum dot heterostructures have a ratio of the extinction coefficients for wavelengths less than 100 nm below the emission peak wavelength to the extinction coefficient at the emission peak wavelength defined by:

$$\frac{\varepsilon_{\lambda \leq \lambda peak - 100}}{\varepsilon_{\lambda peak}} \geq 100.$$

In other words, the extinction coefficient at the emission wavelength is less than 1% as high as the extinction coefficient at wavelengths 100 nm below the emission wavelength.

In some implementations, the quantum dot heterostructures have an emission between 580 and 700 nm with an extinction ratio of over 100. In some implementations, the CdSe could be replaced by a material with a lower energy gap (e.g., InAs, PbSe, PbS, CdTe, CdSeTe, or some CuInGaSe alloys), and the CdS would be replaced by CdTe, InP, CdSeS or other CuInSe alloys to enhance performance in a QuLLT architecture.

In some implementations, the nanomaterials have large Stokes shifts (greater than 50 nm for the spherical CdSe/CdS materials system) and even larger effective Stokes shift (tunable by size), resulting in minimal self-absorption spectral overlap. This characteristic results from an absorption spectrum dominated by the CdS shell material, which occupies most of the quantum dot heterostructure volume, and an emission spectrum determined primarily by the lower bandgap CdSe core. Both absorption and emission remain tunable through quantum size effects, allowing for efficient bandgap matching to the adjacent photovoltaic material 84 of the photovoltaic cells 86 while also minimizing the self-absorption losses that critically hinder dye applications.

In some implementations, the absorption in the shell 184 is 10 to 500 times, 25 to 250 times, or 30 to 100 times higher than the absorption in the core 182. In the latter example, the implication is that there are at least 30 times more sulfur atoms than selenium atoms in such quantum dot heterostructures.

Additionally, the compatibility between the quantum dot heterostructures and transparent matrix material can be controlled by chemical modifications to the surfaces of the shells 184 or the encapsulating material 186. Examples of modifications include: 1) suppression of the hydrophilic units to improve nanocrystal, shell, or encapsulating material compatibility with transparent matrix material and to improve dispersion stability; 2) introduction of chemical functional groups able to coordinate/bind the nanocrystal, shell, or encapsulating material surfaces; and 3) extension of tunability of the mechanical properties through side chains variation. One example of this strategy is to replace a certain percentage of acetate groups with hydroxyl groups on the transparent matrix polymer. Fine tuning this percentage (from 1% to 10%) can greatly increase the dispersion of the quantum dot heterostructures and increase the quantum yield of the luminescent concentrator material 82.

In some implementations, the quantum dot heterostructures have a concentration of 0.1 to 5 $g/m^2$ or 0.3 to 4 $g/m^2$ in the luminescent concentrator material 82. In some implementations, for maximal efficiency of the luminescent lateral transfer concentrator modules 80, the quantum dot heterostructures have a concentration of 0.5 to 2 $g/m^2$ in the luminescent concentrator material 82. (This surface area concentration does not include the surface area of the luminescent lateral transfer solar concentrator module 80 that isn't covered by any the luminescent concentrator material 82.) A concentration within this range will assure that maximal light absorption will occur in the shell 184. As cost is a function of efficiency, this concentration range is also ideal for lowering the cost of the luminescent lateral transfer solar concentrator module 80.

In some implementations, the emission range of the QDHs can be matched to the peak absorption range of the photovoltaic material 84. In particular, the emission range of the QDHs can be adapted to peak within 100 nm on one side of the peak absorption wavelength or range of the photovoltaic material 84 and 50 nm on the other side of the peak absorption wavelength or range of the photovoltaic material 84.

Figure 7:
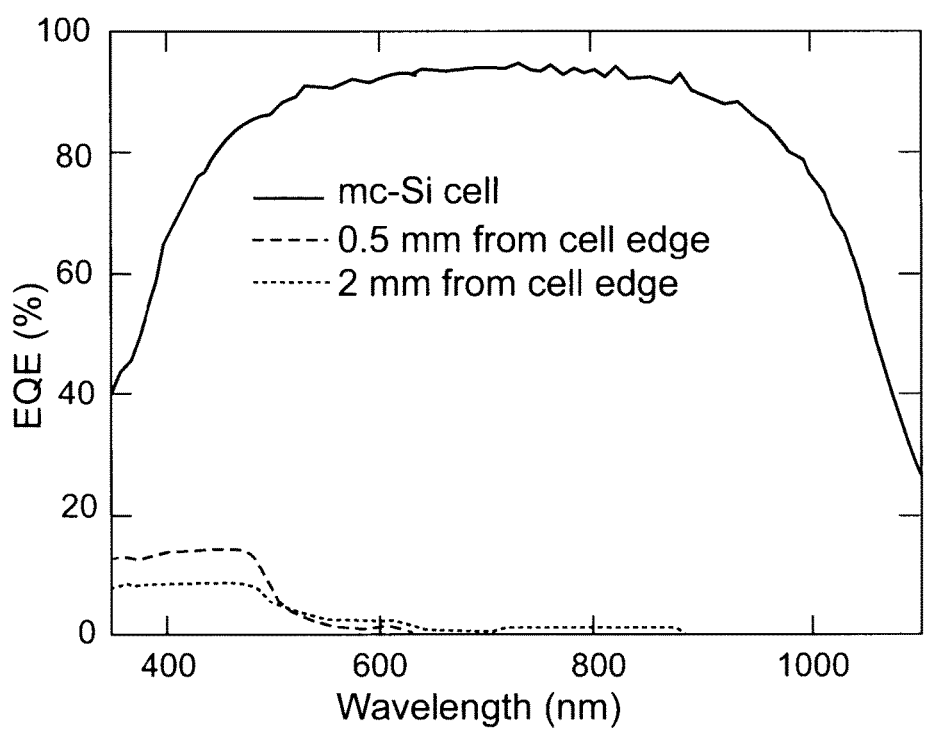
FIG. 7 is a graph showing external quantum efficiency as a function of wavelength for photons incident on the luminescent concentrator material at different distances from an mc-Si cell.

FIG. 7 is a graph showing the external quantum efficiency (EQE or QE) effect of the luminescent concentrator material 82 as a function of wavelength for the photons 32 incident on the luminescent concentrator material at different distances from an mc-Si photovoltaic cell 86 in a luminescent lateral transfer solar concentrator module 80 employing quantum dot heterostructures; and FIG. 7 also shows the external quantum efficiency measurements for an mc-Si photovoltaic cell 86 in a luminescent lateral transfer solar concentrator module 80 employing quantum dot heterostructures. The luminescent lateral transfer solar concentrator module 80 employing quantum dot heterostructures can be conveniently referred to as a quantum luminescent lateral transfer (QuLLT) solar concentrator module 80.

The external quantum efficiency is the percentage of the photons 32 incident on the front surface 92 of the luminescent concentrator material 82 that will produce an electron hole-pair. As previously discussed, the photons 32 incident on the luminescent concentrator material 82 in the intercell area 78 are re-emitted and directed along reflection paths 124 into the photovoltaic material 84 of the photovoltaic cells 86.

The response from intercell area 78 follows the fraction of absorbed light in the luminescent concentrator material 82 and decreases with increasing distance from the photovoltaic material 84. Because there are a photovoltaic cells 86 on the other side of the intercell area 78, the current generated in the intercell area 78 is double (half one way, half the other). The total current generated provides an effective efficiency of 1% from the contribution from the luminescent concentrator material 82. In some implementations, quantum dot heterostructures with short bandgaps are preferred in order to utilize more of the solar spectrum.

With reference again to FIGS. 4B, 4C, and 4D, the spacer materials 140 and 148 may employ the same material used for the transparent matrix material 170. For some embodiments, it may be advantageous to incorporate optically downshifting materials into the spacer materials 140 and 148. Such downshift materials may include downshifting nanomaterials whose wavelength-shifting properties may be matched to optimally cooperate with the primary absorption ranges of the photovoltaic material 84. In particular, the downshifting nanomaterials may employ quantum dot heterostructures or encapsulated quantum dot heterostructures that have the same components and similar properties to those already disclosed. In such embodiments of QuLLT solar modules 80 that employ downshifting material, the downshifting material on top of the front surfaces 88 of the photovoltaic cells 86 can be different (absorb and emit at different wavelengths) from the luminescent material 82 in the intercell areas 78 between the photovoltaic cells 86 making a dual-color QuLLT solar module 80, which can conveniently referred to as a DCQuLLT solar module 80. Downshifting materials, particularly nanomaterials, and their relationships to photovoltaic materials are discussed in detail in U.S. patent application Ser. No. 12/836,511, entitled Light Conversion Efficiency-Enhanced Solar Cell Fabricated with Downshifting Nanomaterial, which is herein incorporated by reference.

The QuLLT and DCQuLLT solar modules 80 can be fabricated by high-throughput, standard solar module-manufacturing techniques based on over 50 years of experience. For example, the luminescent concentrator material 82 (chromophore plus transparent matrix material 170) can be employed in a QuLLT or DCQuLLT solar module 80 either by replacing a standard encapsulant with an extruded sheet, by printing (spray-coating, ink-jet, or screen-printing) onto the top sheet of glass 76, or by printing directly on the photovoltaic cells 84 and on the intercell area 78 of the bottom layer material 98.

Another way that a QuLLT or DCQuLLT solar module 80 has an advantage over an LSC module is in bottom line cost. The success many solar modules depends on the total system costs as compared to the power output of the module. The system cost is composed of the cost of the photovoltaic cells 80, the cost of the luminescent concentrator material 82, the balance of module (BOM) costs (glass, frame, encapsulants, and assembly), and the balance of system (BOS) costs (panel mounts, inverter, installation). The BOM and BOS costs are dependent on surface area.

LSC modules 40 are most efficient when coupled with InGaP photovoltaic cells on the basis of chromophore optical properties. Unfortunately, InGaP photovoltaic cells are prohibitively expensive at a practical concentration. An LSC InGaP module is a prime example in which the BOM and BOS costs are negligible compared to the costs of the photovoltaic materials and the photovoltaic cells.

An alternative is to reduce the photovoltaic cell cost by using relatively inexpensive photovoltaic cells 86, such as silicon-based photovoltaic cells (at a current cost of about $215/m$^2$) at the expense of power output per unit area (efficiency). The QuLLT solar modules 80 are, therefore, the converse of an LSC InGaP module in that the photovoltaic cell costs are negligible when compared to BOS and BOM costs. The QuLLT and DCQuLLT solar modules 80 provide at least twice the power per area that a LSC module 40 provides, greatly reducing the BOS costs.

The QuLLT and DCQuLLT solar modules 80 may have total system costs ($/Watt) that are similar to standard silicon photovoltaic modules because the photovoltaic cells, BOM, and BOS costs are more similar. Given the constraints of high photovoltaic cell cost per Watt of an LSC InGaP module and high BOM and BOS costs per Watt of standard silicon solar cells, employing luminescent layers that laterally transfer and concentrate light, via TIR, into inexpensive photovoltaic cells 86 in a quantum luminescent lateral transfer solar concentrator module 80 or a dual color quantum luminescent lateral transfer solar concentrator module 80 offers a cost-effective compromise. These modules 80 provide a minimum in cost per Watt by optimizing the fractions of the modules 80 that are covered by high efficiency photovoltaic cells 86 and the fractions (intercell areas 78) that are covered by inexpensive luminescent concentrator materials 82.

The QuLLT solar concentrator modules 80 offer flexibly to tailor the design of the modules 80 and its components to optimize system cost, regardless of fluctuations in price for photovoltaic cells 86, photovoltaic materials 84, luminescent concentrator materials 82, and module or system components. Furthermore, in the limit of rapidly decreasing BOS and BOM costs, the technology developed is also directly transferable to LSC modules. As a result, the cost per Watt provided by solar concentrator modules 80 can do no worse than modules of either LSC or standard photovoltaic cells, optimizing high-efficiency and low-cost balance as the market dictates. Moreover, the QuLLT solar concentrator modules 80 can lower the total system cost by reducing the photovoltaic cell costs while maintaining higher efficiencies than LSC systems, thereby making the system less expensive than both LSC modules and standard silicon modules.

Figure 8A:
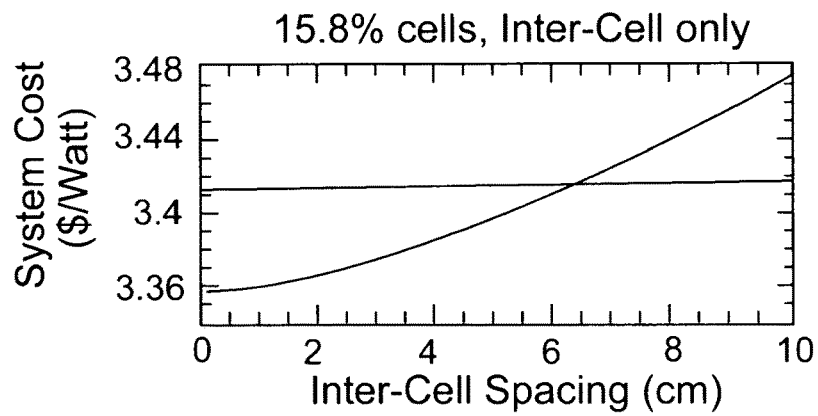
FIGS. 8A, 8B, and 8C are respective graphs of costs per watt versus intercell spacing for QuLLT solar concentrator modules.
Figure 8B:
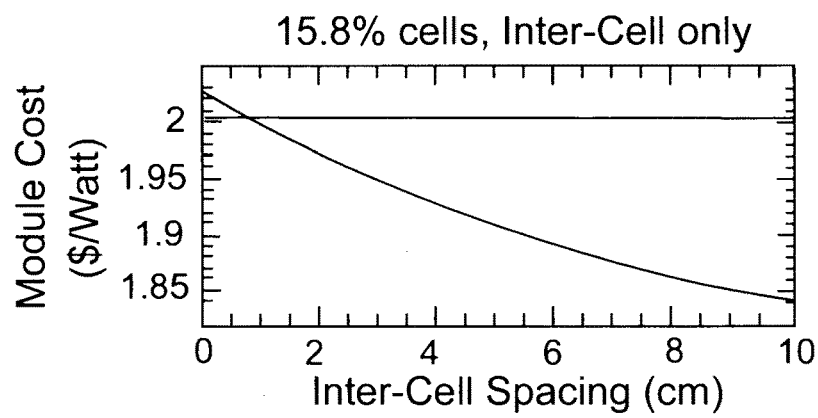
Figure 8C:
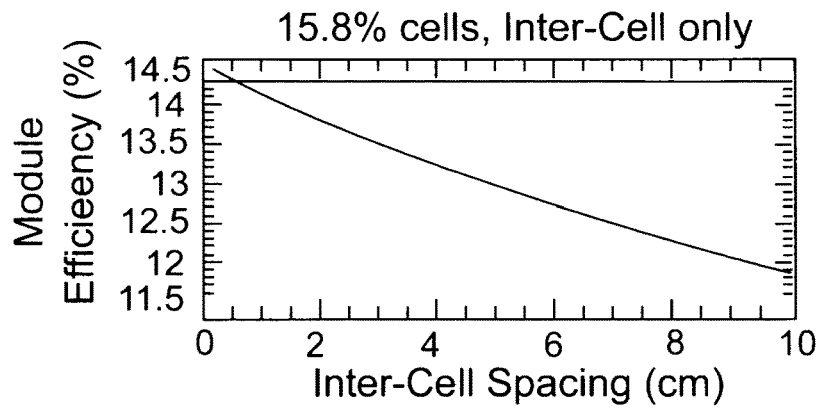
Figure 9A:
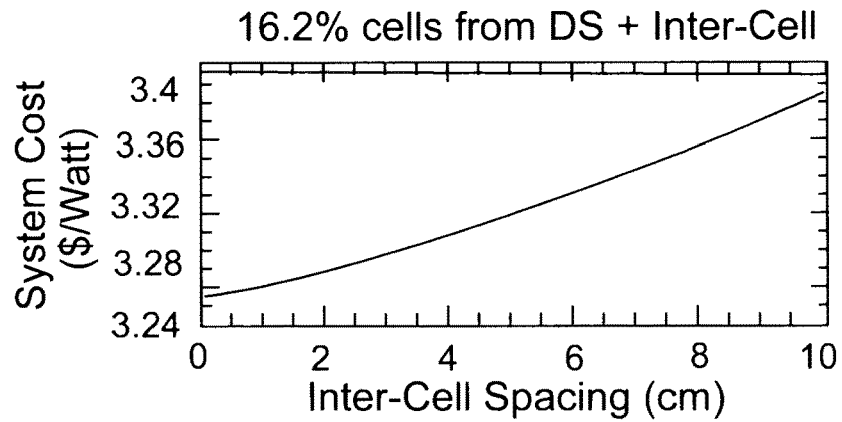
FIGS. 9A, 9B, and 9C are respective graphs of costs per watt versus intercell spacing show for dual color QuLLT (DCQuLLT) solar concentrator modules, in which one luminescent concentrator material occupies the intercell region and another luminescent concentrator material, such as a downshift material, overlays the photovoltaic cells.
Figure 9B:
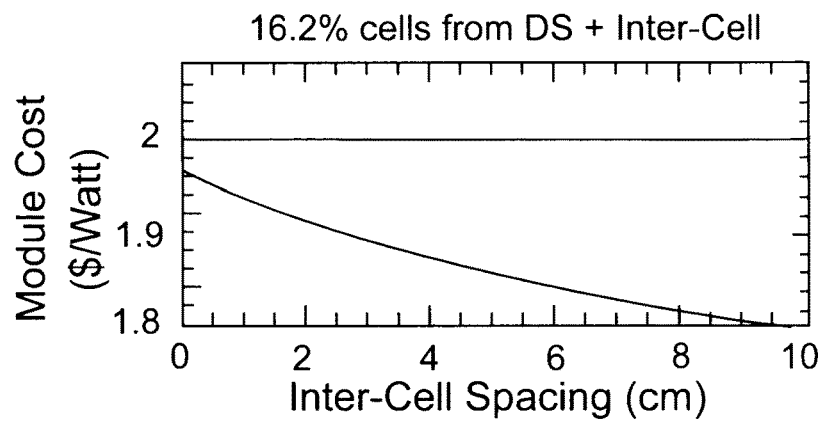
Figure 9C:
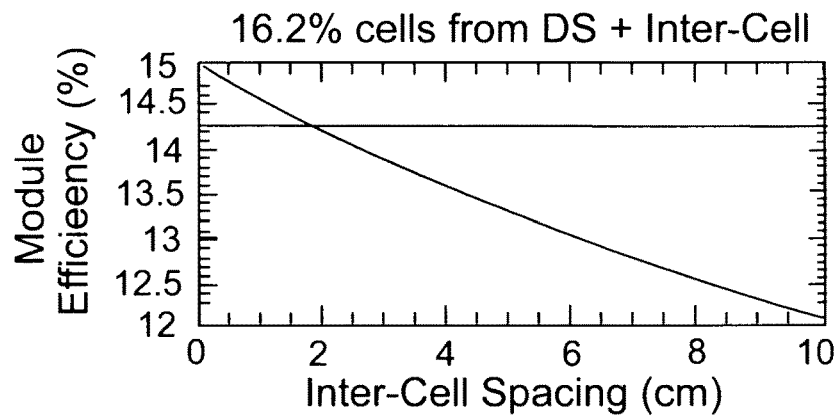

FIGS. 8A, 8B, 8C (Collectively FIG. 8) and 9A, 9B, and 9C (Collectively FIG. 9) are correlated graphs show modeling of the relative costs and efficiencies for respective QuLLT and DCQuLLT solar concentrator modules 80. The relative costs and efficiencies are dependent on chromophore and the inter-cell spacing. With reference to FIGS. 8 and 9, the module efficiency (including frame, etc), the module costs ($/Watt), and the installed system costs ($/Watt) for both QuLLT and DCQuLLT modules are compared. Industry standard estimates are used for balance of module (BOM) and balance of system (BOS) costs and an exemplary cost of $1/gram for the luminescent chromophore. The dashed lines represent the values for standard silicon solar modules.

Exemplary QuLLT solar concentrator modules 80 have already been constructed based on multicrystalline silicon solar cells and CdSe/CdS QDHs.

Figure 10A:
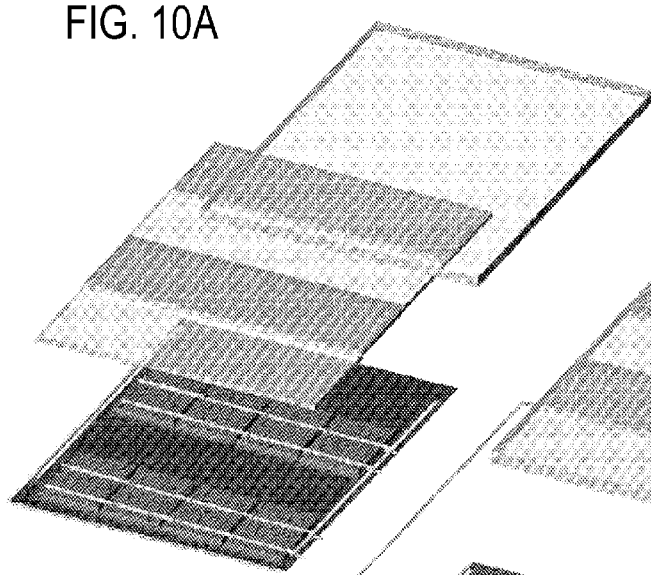
FIGS. 10A, 10B, and 10C show alternative methods of fabricating QuLLT solar concentrator modules.
Figure 10B:
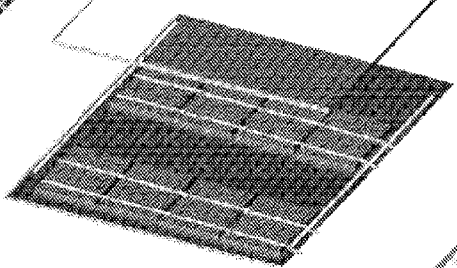
Figure 10C:
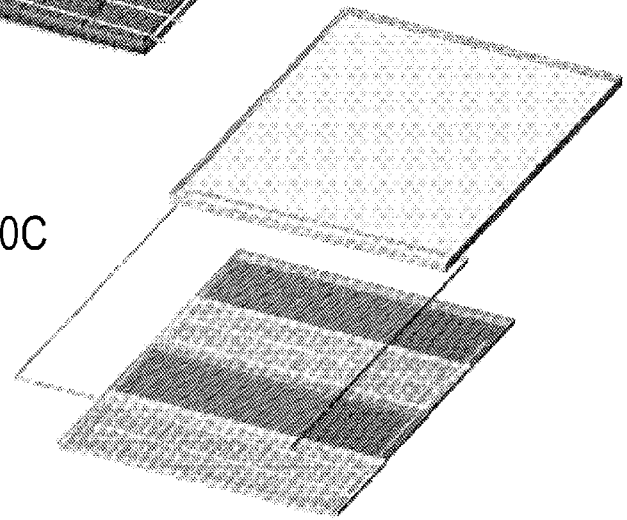

FIGS. 10A, 10B, and 10C show methods of fabricating QuLLT and DCQuLLT solar concentrator modules. These modules can be fabricated in three ways. One involves embedding the quantum dot heterostructures or luminescent concentrator material 82 into a sheet of plastic that is then laminated in addition to, or instead of, a standard solar encapsulant as shown in FIG. 10A. In another method, the luminescent concentrator material 82 is printed onto the underside of standard solar glass (protective layer 76) as shown in FIG. 10B. In another method, the luminescent concentrator material 82 is printed onto the arranged photovoltaic cells 86 and optionally onto the front surface 96 of the bottom layer material 98. The luminescent concentrator material 82, photovoltaic cells 86, and bottom layer material 98 are then laminated with the encapsulant sheet and protective layer 76 as shown in FIG. 10C.

Figure 11:
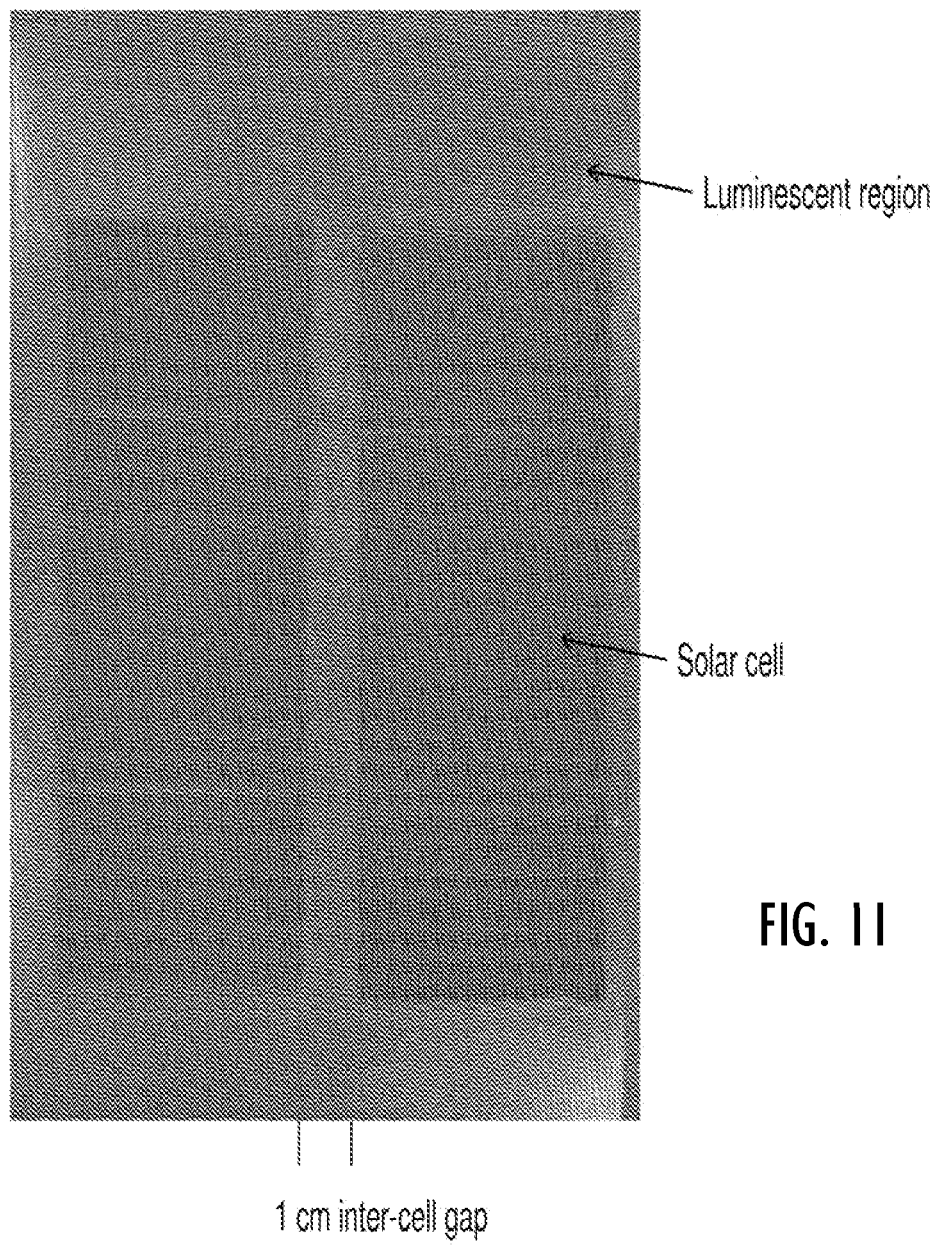
FIG. 11 is a photograph showing an experimental QuLLT submodule that has been built.

FIG. 11 is a photograph showing an experimental QuLLT submodule that has been built. This prototype QuLLT module contains 2 mc-Si photovoltaic cells 86 separated by a 1 cm intercell area 78a in which luminescent concentrator material 82 has been deposited. The luminescent concentrator material 82 also occupies intercell areas 78b and 78c. The quantum dot heterostructures in the luminescent concentrator material 82 is composed of a CdSe core 182 and a CdS shell 184.

In one exemplary module 80, the front surface 88 of the photovoltaic material 84 includes silicon and occupies 43 to 91% of the front surface area of the module 80 and has optional length and width dimensions 108 and 104 of greater than 100 mm. The intercell areas 78 make up 2 to 50% of the front surface area of the module 80, and at least 90% of the intercell areas 78 are occupied by a luminescent concentrator material 82 which includes quantum dot heterostructures dispersed in a transparent matrix material 170 with an index of refraction n optimally between 1.5 and 2 at a concentration optimally between 0.5 and 2 g/m$^2$ of surface area of the luminescent concentrator material 82 (but the concentration could be lower or higher). The quantum dot heterostructures typically exhibit average maximum peak absorption at a wavelength length shorter than 500 nm, although that wavelength is movable to optimally interact with (or not detract from) the active photovoltaic cell 86 making up the module 80. The quantum dot heterostructures exhibit emission that is tunable between wavelengths 580 and 700 nm, optionally contain a core 182 and a shell 184 that provide a ratio of core/shell extinction coefficients of between 1 and 100, and optionally exhibit shell absorption that is 30 to 100 time greater than core absorption. The quantum dot heterostructures optionally have a shell to core volume ratio of between 1 and 100. Any one or more of these exemplary parameters can be substituted with any related parameter disclosed herein to provide numerous optional combinations.

The QuLLT and DCQuLLT solar concentrator module 80 implementations may be integrated with any of the layers or networks disclosed in U.S. Prov. Pat. Appl. No. 61/371,594, filed Aug. 6, 2010, entitled Cooperative Photovoltaic Networks Having Different Photovoltaic Materials, and in International Appl. No. PCT/US2011/045466, filed Jul. 27, 2011, entitled Cooperative Photovoltaic Networks and Photovoltaic Cell Adaptations for Use therein, which are herein incorporated by reference. U.S. Prov. Pat. Appl. No. 61/410,754, filed Nov. 5, 2010, entitled Solar Module Employing Quantum Luminescent Lateral Transfer Concentrator is also herein incorporated by reference.

It will be obvious to those having skill in the art that many changes may be made to the details of the above-described embodiments without departing from the underlying principles of the invention. For example, it will be appreciated that subject matter revealed in any sentence, paragraph, implementation, example, or embodiment can be combined with subject matter from some or all of the other sentences, paragraphs, implementations, examples, or embodiments except where such combinations are mutually exclusive or inoperable. The scope of the present invention should, therefore, be determined only by the following claims.

The invention claimed is:

1. A quantum dot, comprising:
a nanocrystalline core comprising a first semiconductor material; and
one or more nanocrystalline shells comprising a second, different, semiconductor material at least partially surrounding the nanocrystalline core, wherein an absorption spectrum and an emission spectrum of the quantum dot are essentially non-overlapping.

2. The quantum dot of claim 1, wherein the quantum dot has a PLQY of at least 90%.

3. The quantum dot of claim 1, wherein the combination of the nanocrystalline core and the one or more nanocrystalline shells has a non-spherical geometry selected from the group consisting of a nanorod, a nanotetrapod, and a nanosheet.

4. The quantum dot of claim 1, wherein the first semiconductor material is selected from the group consisting of: CdSe, CdS, CdTe, ZnSe, ZnS, ZnTe, $CuS_2$, $CuSe_2$, $In_2S_3$, $In_2Se_3$, $CuGaSe_2$, $CuGaS_2$, $CuInS_2$, $CuInSe_2$, PbSe, PbS, $SiO_2$, $TiO_2$, ZnO, ZrO, and/or any combination of alloys therebetween.

5. The quantum dot of claim 1, wherein the second semiconductor material is selected from the group consisting of: CdSe, CdS, CdTe, ZnSe, ZnS, ZnTe, $CuS_2$, $CuSe_2$, $In_2S_3$, $In_2Se_3$, $CuGaSe_2$, $CuGaS_2$, $CuInS_2$, $CuInSe_2$, PbSe, PbS, $SiO_2$, $TiO_2$, ZnO, ZrO, and/or any combination of alloys therebetween.

6. The quantum dot of claim 5, further comprising a layer of organic aliphatic ligands coupled to the one or more nanocrystalline shells, the ligands selected from a group consisting of phosphoric acids, carboxylic acids, and amines.

7. The quantum dot of claim 6, further comprising an encapsulating coating surrounding the nanocrystalline core and one or more nanocrystalline shells, thereby creating an encapsulated quantum dot heterostructure (QDH).

8. The encapsulated QDH of claim 7, wherein the encapsulating coating passivates the nanocrystalline core and one or more nanocrystalline shells.

9. The encapsulated QDH of claim 7, wherein the encapsulating coating is a silica coating.

10. The encapsulated QDH of claim 9, wherein the silica coating is formed from a micelle.

11. The encapsulated QDH of claim 7, wherein the encapsulating coating has a radius approximately in the range of 1-50 nm, excluding the dimensions of the nanocrystalline core and the one or more nanocrystalline shells.

12. The quantum dot of claim 1, wherein the quantum dot has a maximum light absorption at wavelengths less than approximately 500 nm, and maximum light emission at wavelengths approximately in the range of 550-700 nm.

13. The quantum dot of claim 1, wherein the quantum dot has an emission wavelength with an extinction coefficient less than approximately 1% as high as the extinction coefficient at a wavelength 100 nm below the emission wavelength.

14. The quantum dot of claim 1, wherein the one or more nanocrystalline shells has a light absorption approximately 10-500 times higher than that of the nanocrystalline core.

15. The quantum dot of claim 1, wherein emission from the nanocrystalline core is at least approximately 75% of the total emission from the quantum dot.

16. The quantum dot of claim 1, wherein the first semiconductor material is selected from a group consisting of: InP and CuInSe, and wherein the second semiconductor material is ZnS.

17. The quantum dot of claim 1, wherein the quantum dot exhibits a Stokes shift of greater than 50 nanometers.

18. The quantum dot of claim 1, wherein the nanocrystalline core has a first volume and the nanocrystalline shell has a second volume, and wherein the ratio of second volume to the first volume is in the range of 1 to 100.

19. The quantum dot of claim 1, wherein the nanocrystalline core has a first emission wavelength extinction coefficient and the nanocrystalline shell has a second emission wavelength extinction coefficient, and wherein the ratio of the second emission wavelength extinction coefficient to the first emission wavelength extinction coefficient is in the range of 1 to 100.

20. The quantum dot of claim 1, wherein the nanocrystalline shell has a light absorption approximately 30-100 times higher than that of the nanocrystalline core.

21. A luminescent material, comprising:
a transparent matrix material;
a plurality of encapsulated quantum dot heterostructures dispersed in the transparent matrix material, wherein each encapsulated quantum dot heterostructure comprises:
a nanocrystalline core comprising a first semiconductor material;
one or more nanocrystalline shells comprising a second, different, semiconductor material at least partially surrounding the nanocrystalline core; and
an encapsulating coating surrounding the nanocrystalline core and one or more nanocrystalline shells, wherein an absorption spectrum and an emission spectrum of the quantum dot are essentially non-overlapping.

22. The luminescent material of claim 21, wherein a surface of the nanocrystalline core, a surface of the one or more nanocrystalline shells, or a surface of the encapsulating coating is chemically modified to suppress hydrophilic units to thereby improve core, shell, or encapsulating material compatibility with the transparent matrix material.

23. The luminescent material of claim 21, wherein a surface of the nanocrystalline core, a surface of the one or more nanocrystalline shells, or a surface of the encapsulating coating is chemically modified to introduce chemical functional groups able to coordinate or bind such surfaces.

24. The luminescent material of claim 21, wherein a mechanical property of a surface of the nanocrystalline core, a mechanical property of a surface of the one or more nanocrystalline shells, or a mechanical property of a surface of the encapsulating coating is mechanically tuned to units to thereby improve core, shell, or encapsulating material compatibility with the transparent matrix material.

25. The luminescent material according to claim 21, wherein the matrix material is a transparent matrix polymer with acetate groups, in which a certain percentage of acetate groups is replaced with hydroxyl groups.

* * * * *